United States Patent
Sakui et al.

(10) Patent No.: US 12,245,417 B2
(45) Date of Patent: Mar. 4, 2025

(54) SEMICONDUCTOR-ELEMENT-INCLUDING MEMORY DEVICE

(71) Applicant: Unisantis Electronics Singapore Pte. Ltd., Singapore (SG)

(72) Inventors: Koji Sakui, Tokyo (JP); Nozomu Harada, Tokyo (JP); Masakazu Kakumu, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 197 days.

(21) Appl. No.: 18/179,130

(22) Filed: Mar. 6, 2023

(65) Prior Publication Data
US 2023/0284433 A1    Sep. 7, 2023

(30) Foreign Application Priority Data
Mar. 7, 2022   (WO) .................. PCT/JP2022/009769

(51) Int. Cl.
*G11C 11/40*     (2006.01)
*G11C 11/404*    (2006.01)
(Continued)

(52) U.S. Cl.
CPC ............ *H10B 12/20* (2023.02); *G11C 11/404* (2013.01); *G11C 11/4087* (2013.01); *G11C 11/4091* (2013.01); *G11C 11/4096* (2013.01)

(58) Field of Classification Search
CPC ... H10B 12/20; G11C 11/404; G11C 11/4087; G11C 11/4091; G11C 11/4096; G11C 2211/4016
See application file for complete search history.

(56) References Cited

U.S. PATENT DOCUMENTS

| 5,872,734 A | * | 2/1999 | Tanaka | G11C 7/103 365/185.24 |
|---|---|---|---|---|
| 2003/0111681 A1 | | 6/2003 | Kawanaka | |

(Continued)

FOREIGN PATENT DOCUMENTS

| JP | H02-188966 A | 7/1990 |
|---|---|---|
| JP | H03-171768 A | 7/1991 |

(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: "Impact of Surrounding Gate Transistor (SGT) for Ultra-High-Density LSI's", IEEE Transaction on Electron Devices, vol. 38, No. 3, pp. 573-578 (Mar. 1991).

(Continued)

*Primary Examiner* — Mohammed A Bashar
(74) *Attorney, Agent, or Firm* — Crowell & Moring LLP

(57) ABSTRACT

A memory device includes pages each including memory cells arranged on a substrate. Voltages applied to first and second gate conductor layers and first and second impurity layers in each memory cell are controlled to retain a group of positive holes. In a page write operation, a voltage of the channel semiconductor layer is made equal to a first data retention voltage. In a page erase operation, the group of positive holes are discharged by controlling the voltages, the voltage of the channel semiconductor layer is made equal to a second data retention voltage, and erase and ground voltages are applied to selected and non-selected pages respectively. The first and second impurity layers and first and second gate conductor layers are connected to source, bit, plate, and word lines. The source, word, and plate lines are disposed parallel to the pages. The bit line is disposed perpendicular to the pages.

11 Claims, 16 Drawing Sheets

(51) Int. Cl.
  *G11C 11/408* (2006.01)
  *G11C 11/4091* (2006.01)
  *G11C 11/4096* (2006.01)
  *H10B 12/00* (2023.01)

(56) References Cited

U.S. PATENT DOCUMENTS

| | | | |
|---|---|---|---|
| 2006/0157738 | A1 | 7/2006 | Kawanaka |
| 2008/0137394 | A1 | 6/2008 | Shimano et al. |
| 2008/0251860 | A1 | 10/2008 | Morishita et al. |
| 2011/0127609 | A1 | 6/2011 | Morishita et al. |
| 2016/0049190 | A1* | 2/2016 | Han .................. G11C 11/401 365/51 |
| 2020/0135863 | A1 | 4/2020 | Han et al. |
| 2020/0286545 | A1* | 9/2020 | Yoon .................. G11C 7/106 |

FOREIGN PATENT DOCUMENTS

| | | | |
|---|---|---|---|
| JP | 2003-188279 | A | 7/2003 |
| JP | 3957774 | B2 | 8/2007 |
| JP | 2008-147514 | A | 6/2008 |
| JP | 2017-195395 | A | 10/2017 |
| WO | WO 2005/122244 | A1 | 12/2005 |
| WO | WO 2013/123415 | A1 | 8/2013 |

OTHER PUBLICATIONS

H. Chung, H. Kim, H. Kim, K. Kim, S. Kim, K. W.Song, J. Kim, Y.C. Oh, Y. Hwang, H. Hong, G. Jin, and C. Chung: "Novel 4F2 DRAM Cell with Vertical Pillar Transistor(VPT)," 2011 Proceeding of the European Solid-State Device Research Conference, (2011).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010).

K. Tsunoda, K .Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007), pp. 767-770.

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, vol. 62, No. 6, pp. 1-9 (Jun. 2015).

M. G. Ertosun, K. Lim, C. Park, J. Oh, P. Kirsch, and K. C. Saraswat : "Novel Capacitorless Single-Transistor Charge-Trap DRAM (1T CT DRAM) Utilizing Electron," IEEE Electron Device Letter, vol. 31, No. 5, pp. 405-407 (May 2010).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).

T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006).

E. Yoshida and T. Tanaka: "A Design of a Capacitorless 1T-DRAM Cell Using Gate-induced Drain Leakage (GIDL) Current for Low-power and High-speed Embedded Memory," IEEE IEDM, pp. 913-916, Dec. 2003.

J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.

N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.

H. Jiang, N. Xu, B. Chen, L. Zeng1, Y. He, G. Du, X. Liu and X. Zhang: "Experimental investigation of self heating effect (SHE) in multiple-fin SOI F inFETs," Semicond. Sci. Technol. 29 (2014) 115021 (7pp).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI,"IEICE Trans. Electron., vol. E90-c., No. 4 pp. 765-771 (2007).

International Search Report and Written Opinion in Application No. PCT/JP2022/009769, dated May 31, 2022.

* cited by examiner

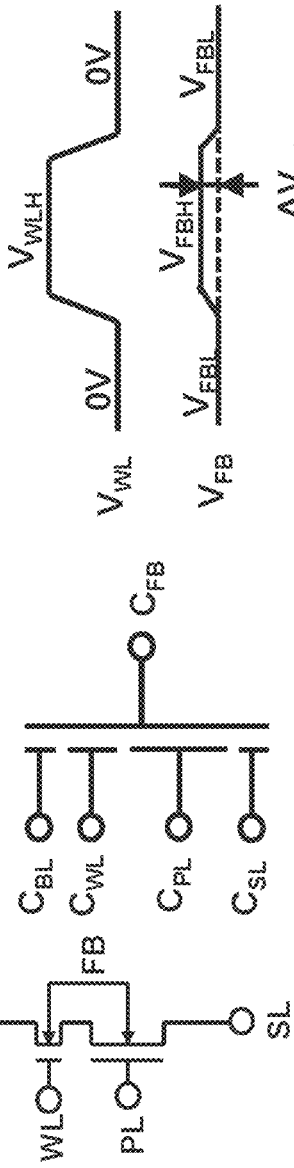

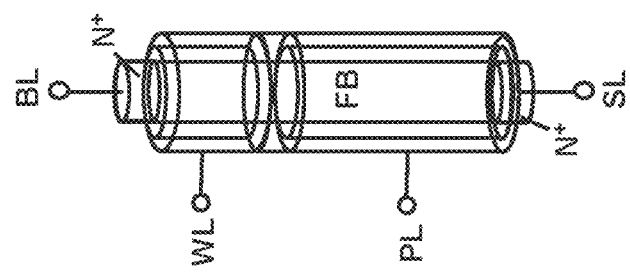

FIG. 2C $$C_{FB} = C_{WL} + C_{PL} + C_{BL} + C_{SL} \quad (1)$$

$$\beta_{WL} = \frac{C_{WL}}{C_{WL} + C_{PL} + C_{BL} + C_{SL}} \quad (2) \Rightarrow \text{SMALL } \beta_{WL}$$

$$\beta_{PL} = \frac{C_{PL}}{C_{WL} + C_{PL} + C_{BL} + C_{SL}} \quad (3) \Rightarrow \text{LARGE } \beta_{PL}$$

$$\beta_{BL} = \frac{C_{BL}}{C_{WL} + C_{PL} + C_{BL} + C_{SL}} \quad (4) \Rightarrow \text{SMALL } \beta_{BL}$$

$$\beta_{SL} = \frac{C_{SL}}{C_{WL} + C_{PL} + C_{BL} + C_{SL}} \quad (5) \Rightarrow \text{SMALL } \beta_{SL}$$

$$\Delta V_{FB} = V_{FBH} - V_{FBL} = \beta_{WL} \times V_{WLH} \quad (6) \text{ SMALL}$$

$$V_{FB}{"1"} = Vb - \beta_{WL} \times Vt_{WL}{"1"} - \beta_{BL} \times V_{BLH} \quad (7)$$

$$\underline{\underline{\text{SMALL}}}$$

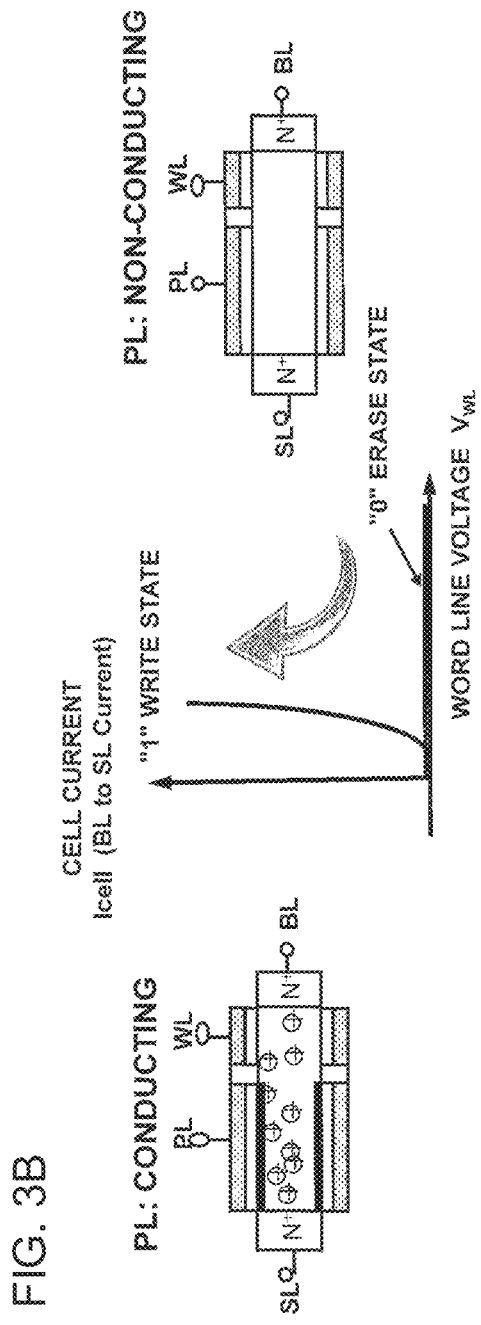

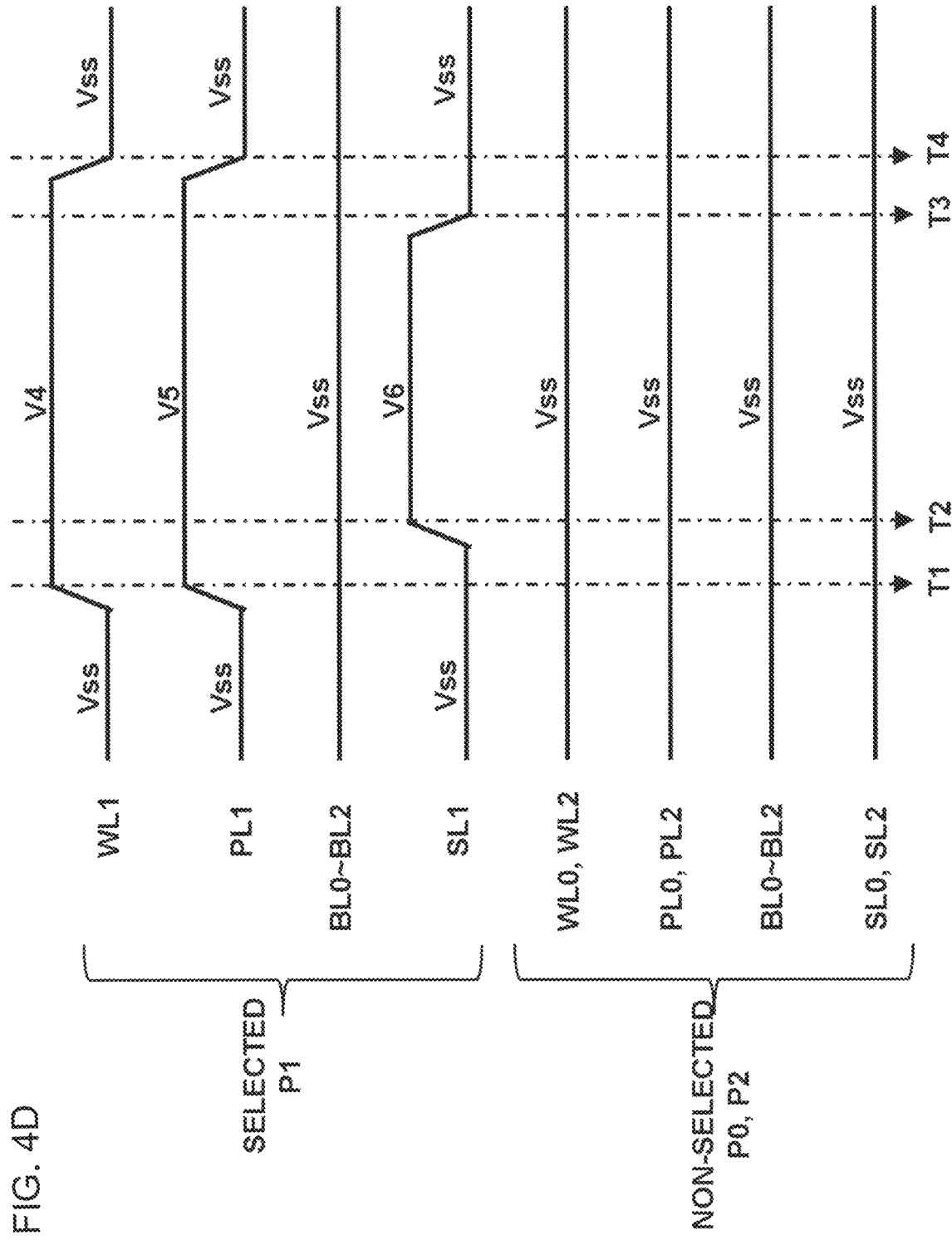

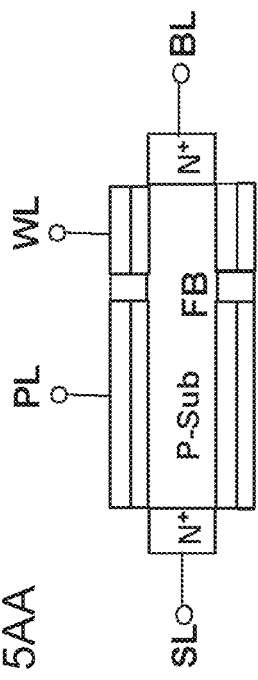
FIG. 5AA
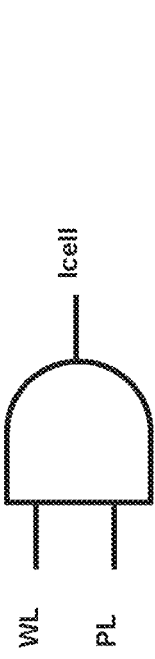
FIG. 5AB
$$I_{cell} = WL \cdot PL \quad (8)$$
FIG. 5AC
| WL | PL | Icell |
|---|---|---|
| 1 | 1 | 1 |
| 1 | 0 | 0 |
| 0 | 1 | 0 |
| 0 | 0 | 0 |

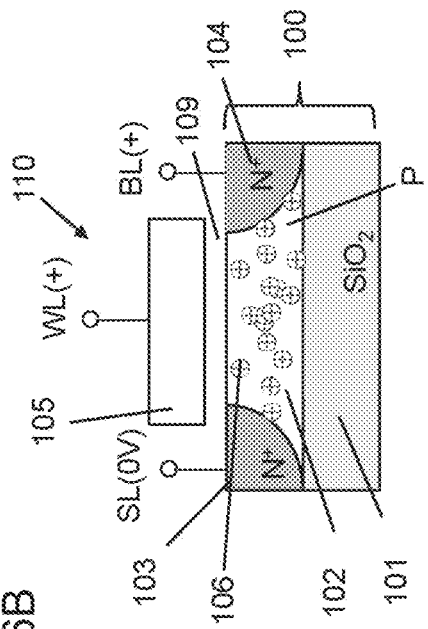
FIG. 6B
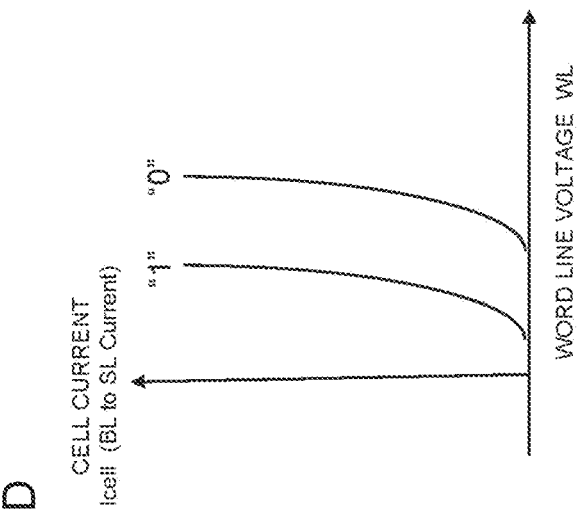
FIG. 6D
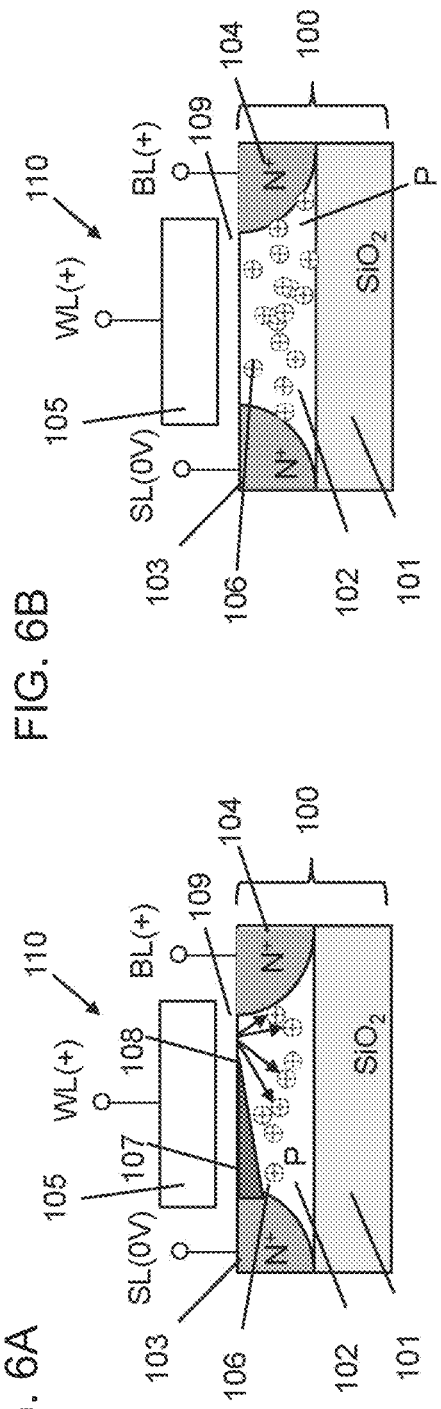
FIG. 6A
FIG. 6C $$C_{FB} = C_{WL} + C_{BL} + C_{SL} \quad (9)$$

$$\beta_{WL} = \frac{C_{WL}}{C_{WL} + C_{BL} + C_{SL}} \quad (10)$$

$$\Delta V_{FB} = V_{FB2} - V_{FB1}$$
$$= \beta_{WL} \times V_{WLH} \quad (11)$$

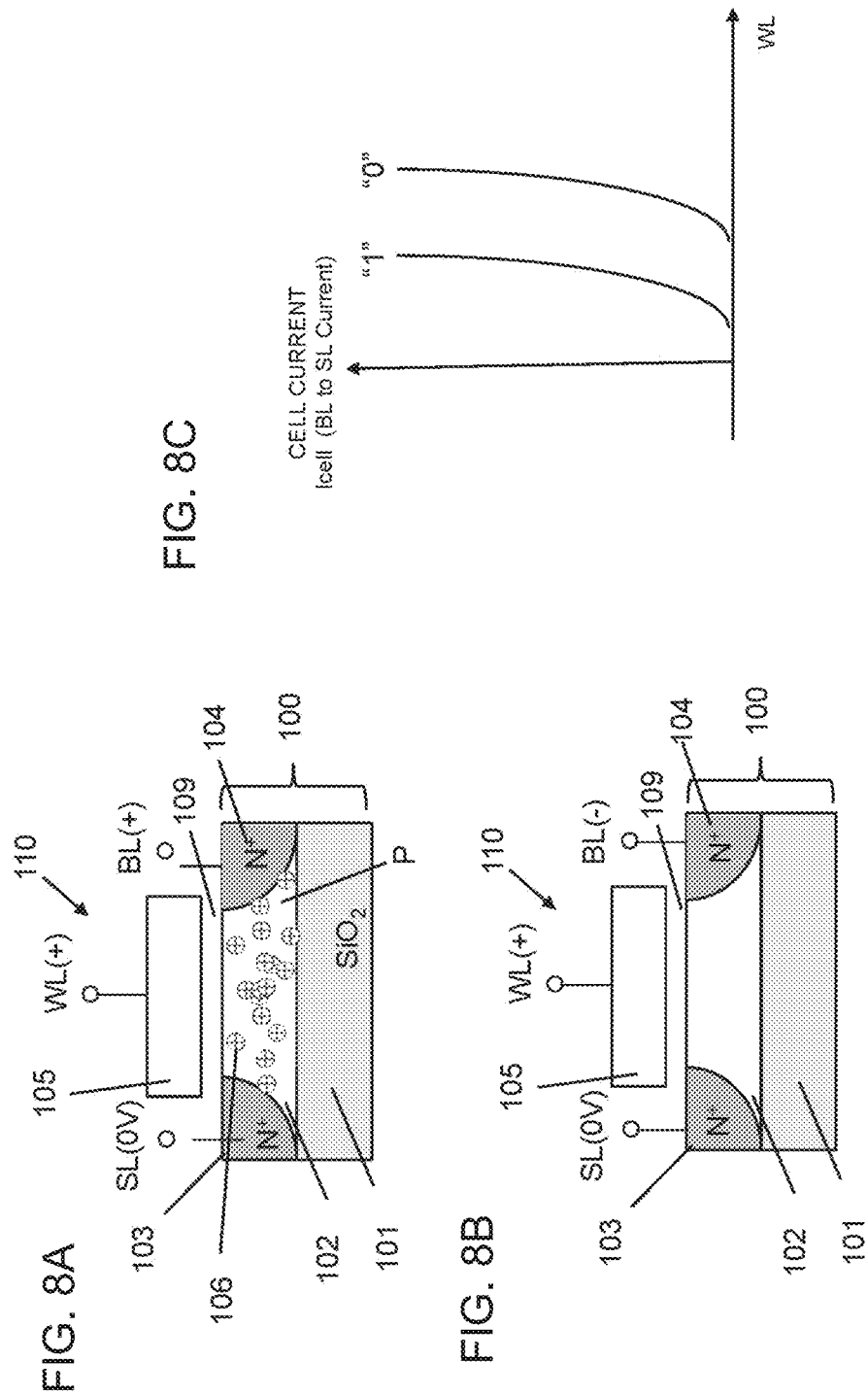

SEMICONDUCTOR-ELEMENT-INCLUDING
MEMORY DEVICE

CROSS REFERENCES TO RELATED
APPLICATIONS

This application claims priority to PCT/JP2022/009769, filed Mar. 7, 2022, the entire content of which is incorporated herein by reference.

BACKGROUND OF THE INVENTION

1. Field of the Invention

The present invention relates to a semiconductor-element-including memory device.

2. Description of the Related Art

Recently, there has been a demand for highly integrated and high-performance memory elements in the development of LSI (Large Scale Integration) technology.

Typical planar MOS transistors include a channel that extends in a horizontal direction along the upper surface of the semiconductor substrate. In contrast, SGTs include a channel that extends in a direction perpendicular to the upper surface of the semiconductor substrate (see, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Accordingly, the density of semiconductor devices can be made higher with SGTs than with planar MOS transistors. Such SGTs can be used as selection transistors to implement highly integrated memories, such as a DRAM (Dynamic Random Access Memory, see, for example, H. Chung, H. Kim, H. Kim, K. Kim, S. Kim, K. W. Song, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)) to which a capacitor is connected, a PCM (Phase Change Memory, see, for example, H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No. 12, December, pp. 2201-2227 (2010)) to which a resistance change element is connected, an RRAM (Resistive Random Access Memory, see, for example, K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V", IEDM (2007)), and an MRAM (Magnetoresistive Random Access Memory, see, for example, W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)) that changes the resistance by changing the orientation of a magnetic spin with a current. Further, there exists, for example, a DRAM memory cell (see Japanese Unexamined Patent Application Publication No. 3-171768 and M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010)) constituted by a single MOS transistor and including no capacitor. The present application relates to a dynamic flash memory that can be constituted only by a MOS transistor and that includes no resistance change element or capacitor.

FIGS. 6A to 6D illustrate a write operation of a DRAM memory cell constituted by a single MOS transistor and including no capacitor described above, FIGS. 7A and 7B illustrate a problem in the operation, and FIGS. 8A to 8C illustrate a read operation (see J. Wan, L. Rojer, A. Zaslavsky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida and T. Tanaka: "A Design of Capacitorless 1T-DRAM Cell Using Gate-Induced Drain Leakage (GIDL) Current for Low-Power and High-Speed Embedded Memory", IEEE IEDM (2003)). FIG. 6A illustrates a "1" write state. Here, the memory cell is formed on an SOI substrate 100, is constituted by a source N+ layer 103 (hereinafter, a semiconductor region that contains a donor impurity in high concentrations is referred to as "$N^+$ layer") to which a source line SL is connected, a drain $N^+$ layer 104 to which a bit line BL is connected, a gate conductor layer 105 to which a word line WL is connected, and a floating body 102 of a MOS transistor 110, and includes no capacitor. The single MOS transistor 110 constitutes the DRAM memory cell. Directly under the floating body 102, a $SiO_2$ layer 101 of the SOI substrate is in contact with the floating body 102. To write "1" to the memory cell constituted by the single MOS transistor 110, the MOS transistor 110 is operated in the saturation region. That is, a channel 107, for electrons, extending from the source $N^+$ layer 103 has a pinch-off point 108 and does not reach the drain $N^+$ layer 104 to which the bit line is connected. When a high voltage is applied to both the bit line BL connected to the drain $N^+$ layer and the word line WL connected to the gate conductor layer 105, and the MOS transistor 110 is operated at the gate voltage that is about one-half of the drain voltage, the electric field intensity becomes maximum at the pinch-off point 108 that is in the vicinity of the drain $N^+$ layer 104. As a result, accelerated electrons that flow from the source $N^+$ layer 103 toward the drain $N^+$ layer 104 collide with the Si lattice, and with kinetic energy lost at the time of collision, electron-positive hole pairs are generated (impact ionization phenomenon). Most of the generated electrons (not illustrated) reach the drain $N^+$ layer 104. Further, a very small proportion of the electrons that are very hot pass through a gate oxide film 109 and reach the gate conductor layer 105. With positive holes 106 that are simultaneously generated, the floating body 102 is charged. In this case, the generated positive holes contribute to an increase in the majority carriers because the floating body 102 is P-type Si. When the floating body 102 is filled with the generated positive holes 106 and the voltage of the floating body 102 becomes higher than that of the source $N^+$ layer 103 by Vb or more, further generated positive holes are discharged to the source $N^+$ layer 103. Here, Vb is the built-in voltage of the PN junction between the source $N^+$ layer 103 and the P-layer floating body 102 and is equal to about 0.7 V. FIG. 6B illustrates a state in which the floating body 102 is charged to saturation with the generated positive holes 106.

Now, a "0" write operation of the memory cell 110 will be described with reference to FIG. 6C. For the common selected word line WL, the memory cell 110 to which "1" is written and the memory cell 110 to which "0" is written are present at random. FIG. 6C illustrates a state of rewriting from a "1" write state to a "0" write state. To write "0", the voltage of the bit line BL is set to a negative bias, and the PN junction between the drain N$^+$ layer 104 and the P-layer floating body 102 is forward biased. As a result, the positive holes 106 in the floating body 102 generated in advance in the previous cycle flow into the drain N$^+$ layer 104 that is connected to the bit line BL. When the write operation ends, the two memory cells are in a state in which the memory cell 110 (FIG. 6B) is filled with the generated positive holes 106, and from the memory cell 110 (FIG. 6C), the generated positive holes are discharged. The potential of the floating body 102 of the memory cell 110 filled with the positive holes 106 becomes higher than that of the floating body 102 in which generated positive holes are not present. Therefore, the threshold voltage of the memory cell 110 to which "1" is written becomes lower than the threshold voltage of the memory cell 110 to which "0" is written. This is illustrated in FIG. 6D.

Now, a problem in the operation of the memory cell constituted by the single MOS transistor 110 will be described with reference to FIGS. 7A and 7B. As illustrated in FIG. 7A, the capacitance $C_{FB}$ of the floating body is equal to the sum of the capacitance $C_{WL}$ between the gate to which the word line is connected and the floating body, the junction capacitance $C_{SL}$ of the PN junction between the source N$^+$ layer 103 to which the source line is connected and the floating body 102, and the junction capacitance $C_{BL}$ of the PN junction between the drain N$^+$ layer 104 to which the bit line is connected and the floating body 102 and is expressed as follows.

$$C_{FB}=C_{WL}+C_{BL}+C_{SL} \quad (9)$$

The capacitive coupling ratio $\beta_{WL}$ between the gate to which the word line is connected and the floating body is expressed as follows.

$$\beta_{WL}=C_{WL}/(C_{WL}+C_{BL}+C_{SL}) \quad (10)$$

Therefore, a change in the word line voltage $V_{WL}$ at the time of reading or writing affects the voltage of the floating body 102 that functions as a storage node (contact point) of the memory cell. This is illustrated in FIG. 7B. When the word line voltage $V_{WL}$ rises from 0 V to $V_{WLH}$ at the time of reading or writing, the voltage $V_{FB}$ of the floating body 102 rises from $V_{FB1}$, which is the voltage in the initial state before the word line voltage changes, to $V_{FB2}$ due to capacitive coupling with the word line. The voltage change amount $\Delta V_{FB}$ is expressed as follows.

$$\Delta V_{FB} = V_{FB2} - V_{FB1} = \beta_{WL} \times V_{WLH} \quad (11)$$

Here, for $\beta_{WL}$ in expression (10), the contribution ratio of $C_{WL}$ is large and, for example, $C_{WL}:C_{BL}:C_{SL}=8:1:1$ holds. This results in $\beta_{WL}=0.8$. When the word line changes, for example, from 5 V at the time of writing to 0 V after the end of writing, the floating body 102 receives an amplitude noise of 5 V×$\beta_{WL}$=4 V due to capacitive coupling between the word line WL and the floating body 102. Accordingly, a sufficient margin is not provided to the potential difference between the "1" potential and the "0" potential of the floating body 102 at the time of writing, which has been a problem.

FIGS. 8A to 8C illustrate a read operation where FIG. 8A illustrates a "1" write state and FIG. 8B illustrates a "0" write state. In actuality, however, even when Vb is set for the floating body 102 to write "1", once the word line returns to 0 V at the end of writing, the floating body 102 is lowered to a negative bias. When "0" is written, the floating body 102 is lowered to a further negative bias, and it is difficult to provide a sufficiently large margin to the potential difference between "1" and "0" at the time of writing as illustrated in FIG. 8C. Therefore, there has been difficulty in commercially introducing DRAM memory cells actually including no capacitor.

There exist twin-transistor memory elements in which a single memory cell is formed in an SOI (Silicon on Insulator) layer by using two MOS transistors (see, for example, US2008/0137394 A1 and US2003/0111681 A1). In these elements, an N$^+$ layer that functions as the source or the drain and that separates the floating body channels of the two MOS transistors is formed so as to be in contact with an insulating layer. This N$^+$ layer is in contact with the insulating layer, and therefore, the floating body channels of the two MOS transistors are electrically isolated from each other. A group of positive holes that are signal charges are accumulated in the floating body channel of one of the transistors. The voltage of the floating body channel in which the group of positive holes are accumulated also changes to a large degree as expressed by expression (11) in response to application of a pulse voltage to the gate electrode of the adjacent MOS transistor as described above. Accordingly, as described with reference to FIGS. 6A to 6D to FIGS. 8A to 8C, it is difficult to provide a sufficiently large operation margin between "1" and "0" at the time of writing (see, for example, F. Morishita, H. Noda, I. Hayashi, T. Gyohten, M. Okamoto, T. Ipposhi, S. Maegawa, K. Dosaka, and K. Arimoto: "Capacitorless Twin-Transistor Random Access Memory (TTRAM) on SOI", IEICE Trans. Electron., Vol. E90-c., No. 4 pp. 765-771, FIG. 8 (2007)).

SUMMARY OF THE INVENTION

In capacitor-less single-transistor DRAMs (gain cells), capacitive coupling between the word line and the floating body is strong. When the potential of the word line is changed at the time of data reading or at the time of data writing, the change is directly transmitted to the floating body as noise, which has been a problem. This causes a problem of erroneous reading or erroneous rewriting of storage data, and it has been difficult to commercially introduce capacitor-less single-transistor DRAMs (gain cells).

To address the above-described problems, a semiconductor-element-including memory device according to the present invention is a memory device in which in plan view on a substrate, a plurality of pages are arranged in a column direction, each of the pages being constituted by a plurality of memory cells arranged in a row direction, each memory cell included in each page including:

a semiconductor body that stands on the substrate in a vertical direction relative to the substrate or that extends along the substrate in a horizontal direction relative to the substrate;

a first impurity layer and a second impurity layer that are disposed at respective ends of the semiconductor body;

a first gate insulator layer that partially or entirely surrounds a side surface of the semiconductor body between the first impurity layer and the second impurity layer and that is in contact with or in close vicinity to the first impurity layer;

a second gate insulator layer that surrounds the side surface of the semiconductor body, that is connected to the first gate insulator layer, and that is in contact with or in close vicinity to the second impurity layer;

a first gate conductor layer that partially or entirely covers the first gate insulator layer;

a second gate conductor layer that covers the second gate insulator layer; and a channel semiconductor layer that is the semiconductor body and that is covered by the first gate insulator layer and the second gate insulator layer, in which voltages applied to the first gate conductor layer, the second gate conductor layer, the first impurity layer, and the second impurity layer are controlled to retain a group of positive holes, generated by an impact ionization phenomenon, inside the channel semiconductor layer, in a page write operation, a voltage of the channel semiconductor layer is made equal to a first data retention voltage that is higher than the voltage of either the first impurity layer or the second impurity layer or that is higher than the voltages of both the first impurity layer and the second impurity layer, in a page erase operation, the group of positive holes are discharged through either the first impurity layer or the second impurity layer or both the first impurity layer and the second impurity layer by controlling the voltages applied to the first impurity layer, the second impurity layer, the first gate conductor layer, and the second gate conductor layer, and the voltage of the channel semiconductor layer is made equal to a second data retention voltage that is lower than the first data retention voltage, the first impurity layer of each memory cell is connected to a corresponding one of source lines, the second impurity layer thereof is connected to a corresponding one of bit lines, one of the first gate conductor layer or the second gate conductor layer thereof is connected to a corresponding one of word lines, and the other of the first gate conductor layer or the second gate conductor layer thereof is connected to a corresponding one of plate lines, the source lines, the word lines, and the plate lines are disposed parallel to the pages in plan view, the bit lines are disposed in a direction perpendicular to the pages, and in the page erase operation, an erase voltage is applied to a page, among the pages, for which selective erasing is performed, and a ground voltage is applied to a non-selected page among the pages (first invention).

In the first invention described above, a first gate capacitance between the first gate conductor layer and the channel semiconductor layer is larger than a second gate capacitance between the second gate conductor layer and the channel semiconductor layer (second embodiment).

In the first invention described above, the ground voltage is zero volts (third embodiment).

In the first invention described above, the erase voltage is a negative voltage lower than or equal to the ground voltage, and in the page erase operation, the erase voltage is applied to a source line, among the source lines, of the page for which selective erasing is performed, a PN junction between the channel semiconductor layer and the first impurity layer of each memory cell in the page is forward biased, and the group of positive holes inside the channel semiconductor layer are discharged to the first impurity layer (fourth embodiment).

In the first invention described above, the erase voltage is a positive voltage higher than or equal to the ground voltage, and in the page erase operation, the erase voltage is applied to a source line, among the source lines, of the page for which selective erasing is performed, a group of electrons are poured into the channel semiconductor layer from the second impurity layer of each memory cell in the page, the group of positive holes inside the channel semiconductor layer are made to be recombined with the group of electrons, and the group of positive holes are made to become extinct (fifth embodiment).

In the first invention described above, in plan view, the source lines are isolated source lines disposed for respective groups of memory cells arranged in the column direction, and are disposed parallel to the word lines and the plate lines (sixth embodiment).

In the first invention described above, in plan view, the source lines include a source line that is disposed so as to be shared between pages adjacent to each other (seventh embodiment).

In the first invention described above, in plan view, the plate lines include a plate line that is disposed so as to be shared between at least two or more pages adjacent to each other (eighth embodiment).

In the first invention described above, the channel semiconductor layer is P-type silicon, and the first impurity layer and the second impurity layer are N-type silicon (ninth embodiment).

In the first invention described above, the word lines, the plate lines, and the source lines are connected to a row decoder circuit, the row decoder circuit receives a row address, and the page is selected in accordance with the row address (tenth embodiment).

In the first invention described above, the bit lines are connected to a sense amplifier circuit, the sense amplifier circuit is connected to a column decoder circuit, the column decoder circuit receives a column address, and the sense amplifier circuit is selectively connected to an input/output circuit in accordance with the column address (eleventh embodiment).

BRIEF DESCRIPTION OF THE DRAWINGS

FIGS. 2A, 2B and 2C are diagrams for explaining an effect attained in a case where the gate capacitance of a first gate conductor layer connected to a plate line is made larger than the gate capacitance of a second gate conductor layer to which a word line is connected in the SGT-including memory device according to the first embodiment;

FIG. 3B includes diagrams for explaining the mechanism of the page write operation of the memory device according to the first embodiment;

FIG. 4D is a diagram for explaining the mechanism of the page erase operation of the memory device according to the first embodiment;

FIGS. 5AA, 5AB and 5AC are diagrams for explaining a mechanism of a read operation of the memory device according to the first embodiment;

FIGS. 6A, 6B, 6C and 6D are diagrams for explaining a write operation of a DRAM memory cell including no capacitor in the related art;

FIGS. 8A, 8B and 8C are diagrams for explaining a read operation of the DRAM memory cell including no capacitor in the related art.

DESCRIPTION OF THE PREFERRED EMBODIMENTS

Hereinafter, a semiconductor-element-including memory device (hereinafter called a dynamic flash memory) according to embodiments of the present invention will be described with reference to the drawings.

First Embodiment

The structure and operation mechanisms of a dynamic flash memory cell according to a first embodiment of the present invention will be described with reference to FIG. 1 to FIGS. 5BA to 5BC. The structure of the dynamic flash memory cell will be described with reference to FIG. 1. An effect attained in a case where the gate capacitance of a first gate conductor layer 5a connected to a plate line PL is made larger than the gate capacitance of a second gate conductor layer 5b to which a word line WL is connected will be described with reference to FIGS. 2A to 2C. A mechanism of a data write operation will be described with reference to FIGS. 3AA to 3AC and FIG. 3B, a mechanism of a data erase operation will be described with reference to FIG. 4A to FIG. 4G, and a mechanism of a data read operation will be described with reference to FIGS. 5AA to 5AC and FIGS. 5BA to 5BC.

Figure 1:
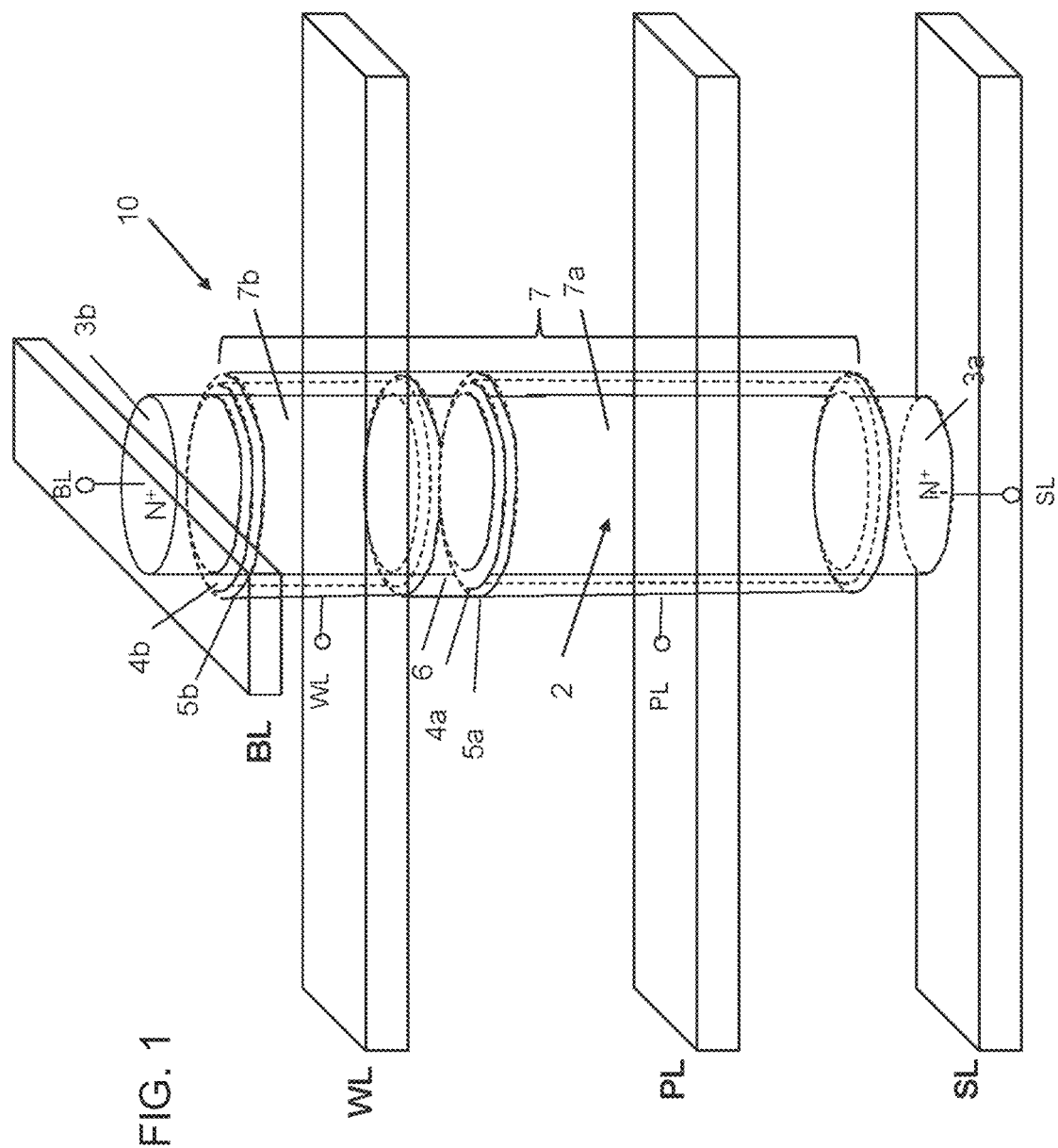
FIG. 1 is a structural diagram of an SGT-including memory device according to a first embodiment.

FIG. 1 illustrates the structure of the dynamic flash memory cell according to the first embodiment of the present invention. On the top and the bottom of a silicon semiconductor column 2 (the silicon semiconductor column is hereinafter referred to as "Si column") (which is an example of "semiconductor body" in the claims) of the P or i (intrinsic) conductivity type formed on a substrate, $N^+$ layers 3a and 3b (which are examples of "first impurity layer" and "second impurity layer" in the claims), one of which functions as the source and the other functions as the drain, are formed respectively. The part of the Si column 2 between the $N^+$ layers 3a and 3b that function as the source and the drain functions as a channel region 7 (which is an example of "channel semiconductor layer" in the claims). Around the channel region 7, a first gate insulator layer 4a (which is an example of "first gate insulator layer" in the claims) and a second gate insulator layer 4b (which is an example of "second gate insulator layer" in the claims) are formed. The first gate insulator layer 4a and the second gate insulator layer 4b are in contact with or in close vicinity to the $N^+$ layers 3a and 3b that function as the source and the drain respectively. Around the first gate insulator layer 4a and the second gate insulator layer 4b, the first gate conductor layer 5a (which is an example of "first gate conductor layer" in the claims) and the second gate conductor layer 5b (which is an example of "second gate conductor layer" in the claims) are formed respectively. The first gate conductor layer 5a and the second gate conductor layer 5b are isolated from each other by an insulating layer 6 (which is also referred to as "first insulating layer"). The channel region 7 between the $N^+$ layers 3a and 3b is constituted by a first channel Si layer 7a surrounded by the first gate insulator layer 4a and a second channel Si layer 7b surrounded by the second gate insulator layer 4b. Accordingly, the $N^+$ layers 3a and 3b that function as the source and the drain, the channel region 7, the first gate insulator layer 4a, the second gate insulator layer 4b, the first gate conductor layer 5a, and the second gate conductor layer 5b constitute a dynamic flash memory cell 10. The $N^+$ layer 3a that functions as the source is connected to a source line SL (which is an example of "source line" in the claims), the $N^+$ layer 3b that functions as the drain is connected to a bit line BL (which is an example of "bit line" in the claims), the first gate conductor layer 5a is connected to the plate line PL (which is an example of "plate line" in the claims), and the second gate conductor layer 5b is connected to the word line WL (which is an example of "word line" in the claims). As illustrated in FIG. 1, the word line WL, the plate line PL, and the source line SL are disposed in parallel, and the bit line BL is disposed in a direction perpendicular to the word line WL, the plate line PL, and the source line SL. Desirably, the dynamic flash memory cell has a structure in which the gate capacitance of the first gate conductor layer 5a connected to the plate line PL is larger than the gate capacitance of the second gate conductor layer 5b connected to the word line WL.

In FIG. 1, to make the gate capacitance of the first gate conductor layer 5a connected to the plate line PL larger than the gate capacitance of the second gate conductor layer 5b to which the word line WL is connected, the gate length (the length of the gate in the central-axis direction of the Si semiconductor column 2) of the first gate conductor layer 5a is made longer than the gate length of the second gate conductor layer 5b. Alternatively, instead of making the gate length of the first gate conductor layer 5a longer than the gate length of the second gate conductor layer 5b, the thicknesses of the respective gate insulator layers may be made different such that the thickness of the gate insulating film of the first gate insulator layer 4a is thinner than the thickness of the gate insulating film of the second gate insulator layer 4b. Alternatively, the dielectric constants of the materials of the respective gate insulator layers may be made different such that the dielectric constant of the gate insulating film of the first gate insulator layer 4a is higher than the dielectric constant of the gate insulating film of the second gate insulator layer 4b. The gate capacitance of the first gate conductor layer 5a connected to the plate line PL may be made larger than the gate capacitance of the second gate conductor layer 5b to which the word line WL is connected, by a combination of any of the lengths of the gate conductor layers 5a and 5b and the thicknesses and dielectric constants of the gate insulator layers 4a and 4b.

FIGS. 2A to 2C are diagrams for explaining an effect attained in a case where the gate capacitance of the first gate conductor layer 5a connected to the plate line PL is made larger than the gate capacitance of the second gate conductor layer 5b to which the word line WL is connected.

FIG. 2A is a simplified structural diagram of the dynamic flash memory cell according to the first embodiment of the present invention and illustrates only main parts. To the dynamic flash memory cell, the bit line BL, the word line WL, the plate line PL, and the source line SL are connected, and the potential state of the channel region 7 is determined by the voltage states of the lines.

FIG. 2B is a diagram for explaining the capacitance relationships of the respective lines. The capacitance $C_{FB}$ of the channel region 7 is equal to the sum of the capacitance $C_{WL}$ between the gate conductor layer 5b to which the word line WL is connected and the channel region 7, the capacitance $C_{PL}$ between the gate conductor layer 5a to which the plate line PL is connected and the channel region 7, the junction capacitance $C_{SL}$ of the PN junction between the source $N^+$ layer 3a to which the source line SL is connected and the channel region 7, and the junction capacitance $C_{BL}$ of the PN junction between the drain $N^+$ layer 3b to which the bit line BL is connected and the channel region 7, and is expressed as follows.

$$C_{FB} = C_{WL} + C_{PL} + C_{BL} + C_{SL} \quad (1)$$

Therefore, the coupling ratio $\beta_{WL}$ between the word line WL and the channel region 7, the coupling ratio BPL between the plate line PL and the channel region 7, the coupling ratio $\beta_{BL}$ between the bit line BL and the channel region 7, and the coupling ratio $\beta_{SL}$ between the source line SL and the channel region 7 are expressed as follows.

$$\beta_{WL} = C_{WL}/(C_{WL} + C_{PL} + C_{BL} + C_{SL}) \quad (2)$$

$$\beta_{PL} = C_{PL}/(C_{WL} + C_{PL} + C_{BL} + C_{SL}) \quad (3)$$

$$\beta_{BL} = C_{BL}/(C_{WL} + C_{PL} + C_{BL} + C_{SL}) \quad (4)$$

$$\beta_{SL} = C_{SL}/(C_{WL} + C_{PL} + C_{BL} + C_{SL}) \quad (5)$$

Here, $C_{PL} > C_{WL}$ holds, and therefore, this results in $BPL > \beta_{WL}$.

FIG. 2C is a diagram for explaining a change in the voltage $V_{FB}$ of the channel region 7 when the voltage $V_{WL}$ of the word line WL rises at the time of a read operation or a write operation and subsequently drops. Here, the potential difference $\Delta V_{FB}$ when the voltage $V_{FB}$ of the channel region 7 transitions from a low-voltage state $V_{FBL}$ to a high-voltage state $V_{FBH}$ in response to the voltage $V_{WL}$ of the word line WL rising from 0 V to a high-voltage state $V_{WLH}$ is expressed as follows.

$$\Delta V_{FB} = V_{FBH} - V_{FBL} = \beta_{WL} \times V_{WLH} \quad (6)$$

The coupling ratio $\beta_{WL}$ between the word line WL and the channel region 7 is small and the coupling ratio $\beta_{PL}$ between the plate line PL and the channel region 7 is large, and therefore, $\Delta V_{FB}$ is small, and the voltage $V_{FB}$ of the channel region 7 negligibly changes even when the voltage $V_{WL}$ of the word line WL changes at the time of a read operation or a write operation.

Figure 3A:
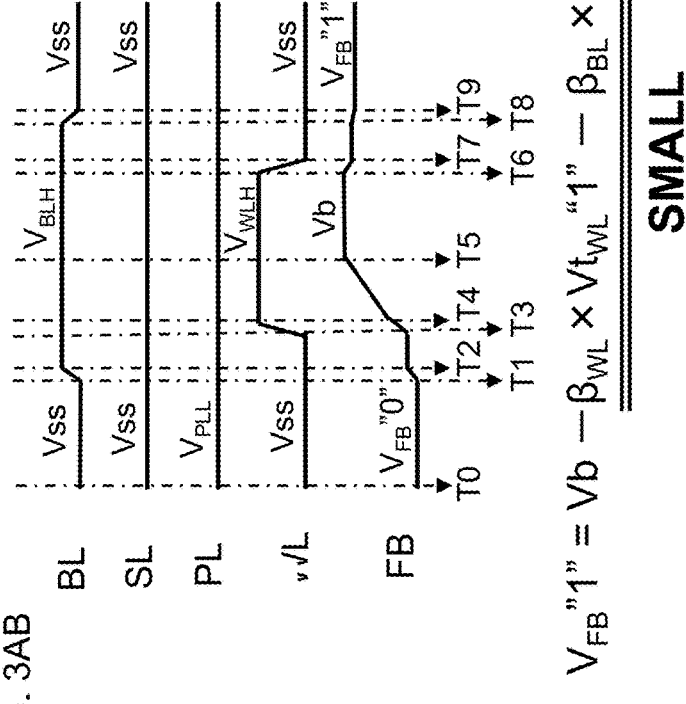
FIGS. 3AA, 3AB and 3AC are diagrams for explaining a mechanism of a page write operation of the memory device according to the first embodiment.
Figure 3A:
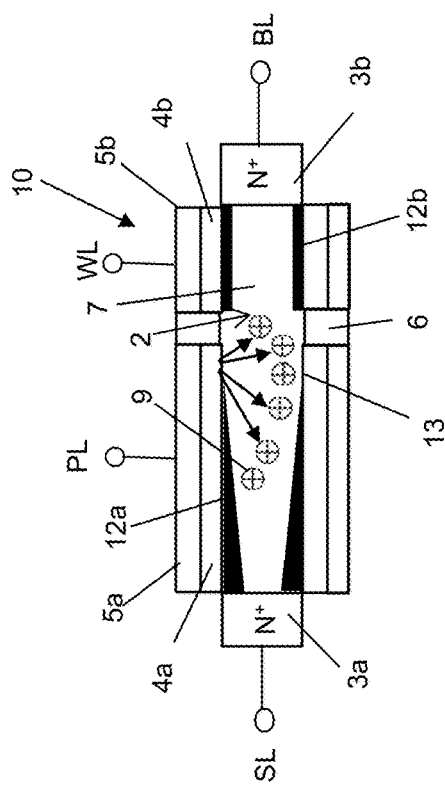
Figure 3A:
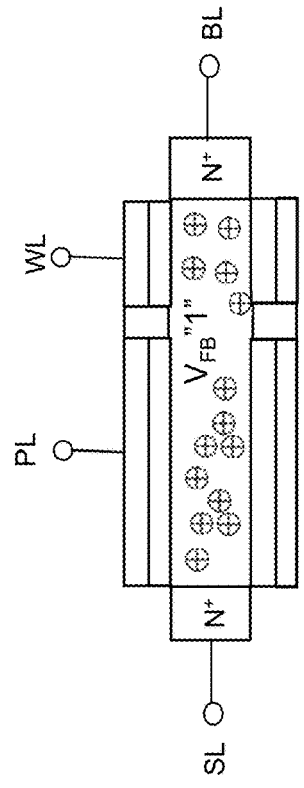

FIGS. 3AA to 3AC and FIG. 3B illustrate a page write operation (which is an example of "page write operation" in the claims) of the dynamic flash memory cell according to the first embodiment of the present invention. FIG. 3AA illustrates a mechanism of the write operation, and FIG. 3AB illustrates operation waveforms of the bit line BL, the source line SL, the plate line PL, the word line WL, and the channel region 7 that functions as a floating body FB. At time T0, the dynamic flash memory cell is in a "0" erase state, and the voltage of the channel region 7 is equal to $V_{FB}$"0". Vss is applied to the bit line BL, the source line SL, and the word line WL, and $V_{PLL}$ is applied to the plate line PL. Here, for example, Vss is equal to 0 V and $V_{PLL}$ is equal to 2 V. Subsequently, from time T1 to time T2, when the bit line BL rises from Vss to $V_{BLH}$, in a case where, for example, Vss is equal to 0 V, the voltage of the channel region 7 becomes equal to $V_{FB}$"0"+$\beta_{BL} \times V_{BLH}$ due to capacitive coupling between the bit line BL and the channel region 7.

The description of the write operation of the dynamic flash memory cell will be continued with reference to FIGS. 3AA and 3AB. From time T3 to time T4, the word line WL rises from Vss to $V_{WLH}$. Accordingly, when the threshold voltage for "0" erase of a second N-channel MOS transistor region that is a region in which the second gate conductor layer 5b to which the word line WL is connected surrounds the channel region 7 is denoted by $Vt_{WL}$"0", as the voltage of the word line WL rises, in a range from Vss to $Vt_{WL}$"0", the voltage of the channel region 7 becomes equal to $V_{FB}$"0"+$\beta_{BL} \times V_{BLH}$+$\beta_{WL} \times Vt_{WL}$"0" due to second capacitive coupling between the word line WL and the channel region 7. When the voltage of the word line WL rises to $Vt_{WL}$"0" or above, an inversion layer 12b in a ring form is formed in the channel region 7 on the inner periphery of the second gate conductor layer 5b and interrupts the second capacitive coupling between the word line WL and the channel region 7.

The description of the write operation of the dynamic flash memory cell will be continued with reference to FIGS. 3AA and 3AB. From time T3 to time T4, for example, a fixed voltage $V_{PLL}$=2 V is applied to the first gate conductor layer 5a to which the plate line PL is connected, and the second gate conductor layer 5b to which the word line WL is connected is increased to, for example, $V_{WLH}$=4 V. As a result, as illustrated in FIG. 3AA, an inversion layer 12a in a ring form is formed in the channel region 7 on the inner periphery of the first gate conductor layer 5a to which the plate line PL is connected, and a pinch-off point 13 is present in the inversion layer 12a. As a result, a first N-channel MOS transistor region including the first gate conductor layer 5a operates in the saturation region. In contrast, the second N-channel MOS transistor region including the second gate conductor layer 5b to which the word line WL is connected operates in the linear region. As a result, a pinch-off point is not present in the channel region 7 on the inner periphery of the second gate conductor layer 5b to which the word line WL is connected, and the inversion layer 12b is formed on the entire inner periphery of the gate conductor layer 5b. The inversion layer 12b that is formed on the entire inner periphery of the second gate conductor layer 5b to which the word line WL is connected substantially functions as the drain of the second N-channel MOS transistor region including the second gate conductor layer 5b. As a result, the electric field becomes maximum in a first boundary region of the channel region 7 between the first N-channel MOS transistor region including the first gate conductor layer 5a and the second N-channel MOS transistor region including the second gate conductor layer 5b that are connected in series, and an impact ionization phenomenon occurs in this region. This region is a source-side region when viewed from the second N-channel MOS transistor region including the second gate conductor layer 5b to which the word line WL is connected, and therefore, this phenomenon is called a source-side impact ionization phenomenon. By this source-side impact ionization phenomenon, electrons flow from the N$^+$ layer 3a to which the source line SL is connected toward the N$^+$ layer 3b to which the bit line is connected. The accelerated electrons collide with lattice Si atoms, and electron-positive hole pairs are generated by the kinetic energy. Although some of the generated electrons flow into the first gate conductor layer 5a and into the second gate conductor layer 5b, most of the generated electrons flow into the N$^+$ layer 3b to which the bit line BL is connected (not illustrated).

As illustrated in FIG. 3AC, a generated group of positive holes 9 (which is an example of "group of positive holes" in the claims) are majority carriers in the channel region 7, with which the channel region 7 is charged to a positive bias. The N$^+$ layer 3a to which the source line SL is connected is at 0 V, and therefore, the channel region 7 is charged up to the built-in voltage Vb (about 0.7 V) of the PN junction between the N$^+$ layer 3a to which the source line SL is connected and the channel region 7. When the channel region 7 is charged to a positive bias, the threshold voltages of the first N-channel MOS transistor region and the second N-channel MOS transistor region decrease due to a substrate bias effect.

The description of the write operation of the dynamic flash memory cell will be continued with reference to FIG. 3AB. From time T6 to time T7, the voltage of the word line WL drops from $V_{WLH}$ to Vss. During this period, although the second capacitive coupling is formed between the word line WL and the channel region 7, the inversion layer 12b interrupts the second capacitive coupling until the voltage of the word line WL drops from $V_{WLH}$ to a threshold voltage $Vt_{WL}$"1" of the second N-channel MOS transistor region or below when the voltage of the channel region 7 is equal to Vb. Therefore, the capacitive coupling between the word line WL and the channel region 7 is substantially formed only during a period from when the word line WL drops to $Vt_{WL}$"1" or below to when the word line WL drops to Vss. As a result, the voltage of the channel region 7 becomes equal to Vb-$\beta_{WL}$×$Vt_{WL}$ "1". Here, $Vt_{WL}$ "1" is lower than $Vt_{WL}$"0" described above, and $\beta_{WL}$×$Vt_{WL}$ "1" is small.

The description of the page write operation of the dynamic flash memory cell will be continued with reference to FIG. 3AB. From time T8 to time T9, the bit line BL drops from $V_{BLH}$ to Vss. The bit line BL and the channel region 7 are capacitively coupled with each other, and therefore, the "1" write voltage $V_{FB}$"1" of the channel region 7 becomes as follows at the end.

$$V_{FB}\text{"1"}=Vb-\beta_{WL}\times Vt_{WL}\text{"1"}-\beta_{BL}\times V_{BLH} \tag{7}$$

Here, the coupling ratio $\beta_{BL}$ between the bit line BL and the channel region 7 is also small. Accordingly, as illustrated in FIG. 3B, the threshold voltage of the second N-channel MOS transistor region of the second channel region 7b to which the word line WL is connected decreases. The memory write operation in which the voltage $V_{FB}$"1" in the "1" write state of the channel region 7 is assumed to be a first data retention voltage (which is an example of "first data retention voltage" in the claims) is performed to assign logical storage data "1". In the "0" erase state of the channel region 7, the threshold voltage of the first N-channel MOS transistor region of the first channel region 7a to which the plate line PL is connected and that of the second N-channel MOS transistor region of the second channel region 7b to which the word line WL is connected increase, and therefore, when the voltage applied to the plate line PL is set to the threshold voltage or below, a cell current Icell does not flow even when the voltage of the word line WL is increased.

At the time of the write operation, electron-positive hole pairs may be generated by an impact ionization phenomenon in a second boundary region between the first impurity layer 3a and the first channel semiconductor layer 7a or in a third boundary region between the second impurity layer 3b and the second channel semiconductor layer 7b instead of the first boundary region, and the channel region 7 may be charged with the generated group of positive holes 9.

Note that the conditions of voltages applied to the bit line BL, the source line SL, the word line WL, and the plate line PL and the potential of the floating body described above are examples for performing the write operation, and other operation conditions based on which the write operation can be performed may be employed.

A mechanism of a page erase operation (which is an example of "page erase operation" in the claims) will be described with reference to FIG. 4A to FIG. 4G.

Figure 4A:
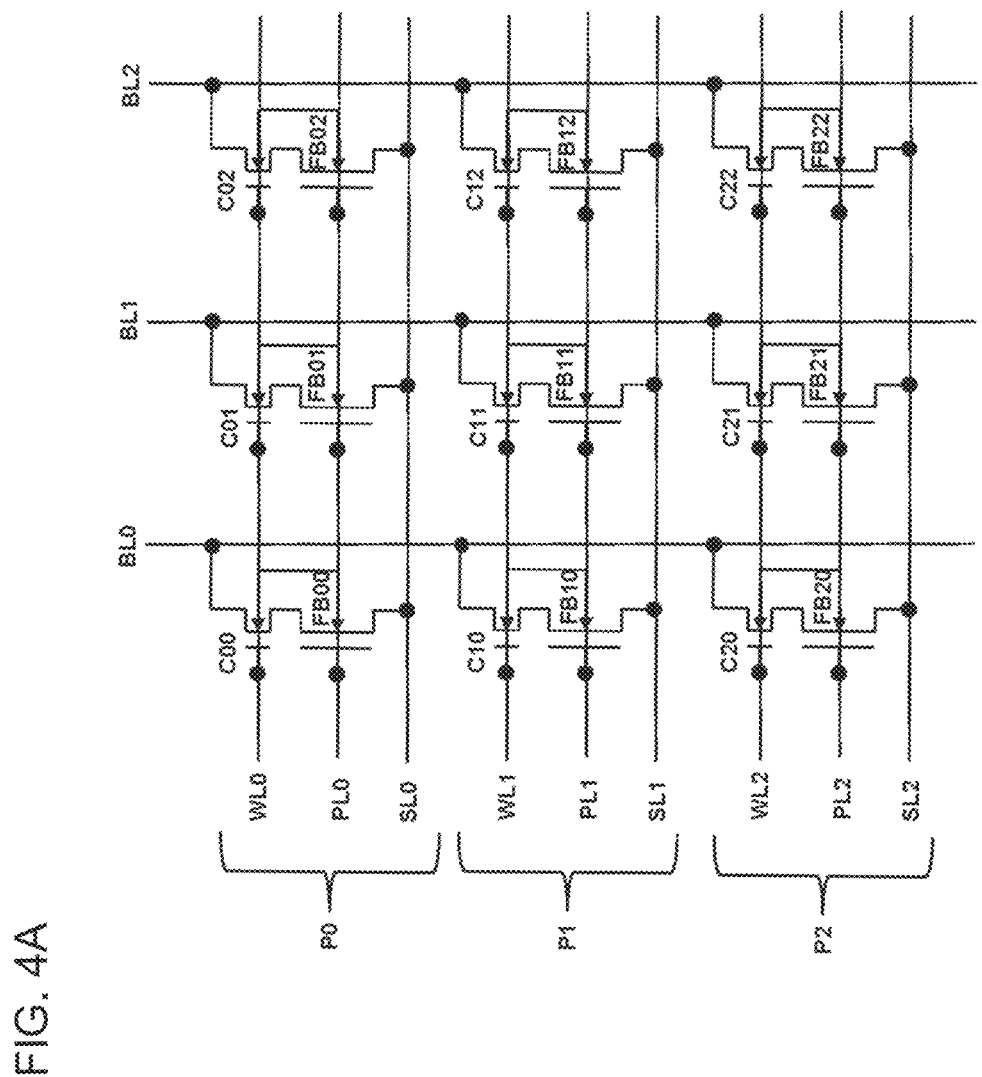
FIG. 4A is a diagram for explaining a mechanism of a page erase operation of the memory device according to the first embodiment.

FIG. 4A is a circuit diagram of a memory block for explaining the page erase operation. Although nine memory cells C00 to C22 in three rows and three columns in plan view are illustrated, the actual memory block is larger than this matrix. When memory cells are arranged in a matrix, one of the directions of the arrangement is called "row direction" (or "in rows") and the direction perpendicular to the one of the directions is called "column direction" (or "in columns"). To each of the memory cells, a corresponding one of the source line SL0 to SL2, a corresponding one of the bit lines BL0 to BL2, a corresponding one of the plate lines PL0 to PL2, and a corresponding one of the word lines WL0 to WL2 are connected. The source lines SL0 to SL2, the plate lines PL0 to PL2, and the word lines WL0 to WL2 are disposed in parallel, and the bit lines BL0 to BL2 are disposed in a direction perpendicular to the source lines SL0 to SL2, the plate lines PL0 to PL2, and the word lines WL0 to WL2. For example, it is assumed that the memory cells C10 to C12, in a certain page (which is an example of "page" in the claims) P1, to which the plate line PL1, the word line WL1, and the source line SL1 are connected are selected in this block and a page erase operation is performed.

Figure 4B:
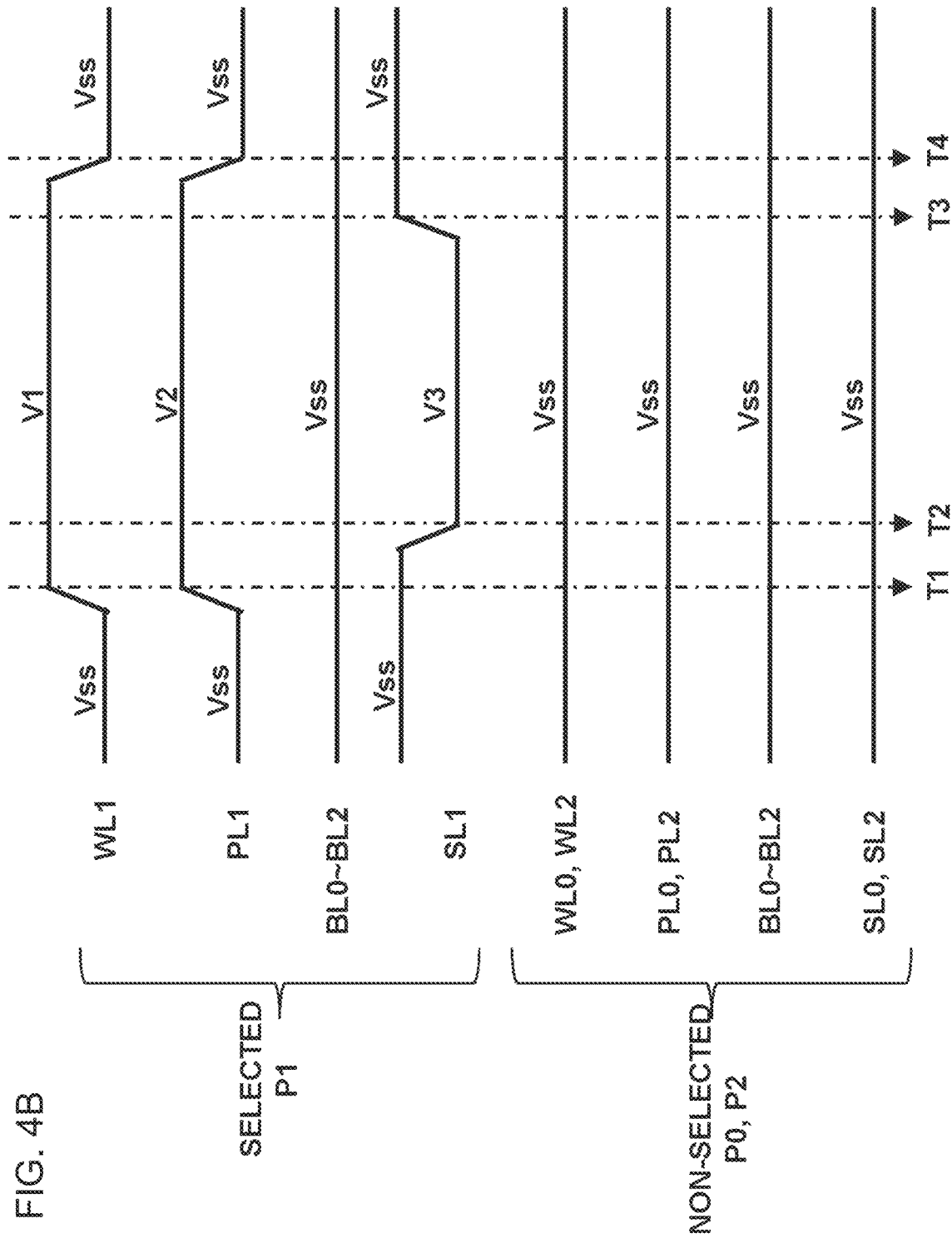
FIG. 4B is a diagram for explaining the mechanism of the page erase operation of the memory device according to the first embodiment.

FIG. 4B is an operation waveform diagram of the page erase operation. A case where the page erase operation starts and, for example, selective erasing for the page P1 is performed will be described. At a first time T1, the word line WL1 and the plate line PL1 rise from a ground voltage (which is an example of "ground voltage" in the claims) Vss to a first voltage V1 and a second voltage V2 respectively. Here, the ground voltage Vss is equal to, for example, 0 V. The first voltage V1 and the second voltage V2 are equal to, for example, 1 V. Next, at a second time T2, the source line SL1 drops from the ground voltage Vss to a third voltage V3. Here, the third voltage V3 is a negative voltage (which is an example of "negative voltage" in the claims) and is equal to, for example, −1 V. As a result, the PN junction between the first impurity layer 3a, which is an N$^+$ layer, and the channel region 7, which is a P layer, is forward biased, and the group of positive holes 9 accumulated in the channel region 7 are discharged to the first impurity layer 3a. When the discharge of the group of positive holes 9 accumulated in the channel region 7 approaches saturation, at a third time T3, the source line SL1 returns from the third voltage V3 to the ground voltage Vss, and at a fourth time T4, the word line WL1 and the plate line PL1 respectively return from the first voltage V1 and the second voltage V2 to the ground voltage Vss, and the page erase operation ends. The page erase operation in which the voltage $V_{FB}$ "0" in the "0" erase state of the channel region 7 is assumed to be a second data retention voltage (which is an example of "second data retention voltage" in the claims) is performed to assign logical storage data "0".

Note that one of the word line WL1 or the plate line PL1 may rise from the ground voltage Vss to the first voltage V1 or the second voltage V2 before or after the first time T1. The source line SL1 may drop from the ground voltage Vss to the third voltage V3 before the first time T1. One of the word line WL1 or the plate line PL1 may return from the first voltage V1 or the second voltage V2 to the ground voltage Vss before or after the fourth time T4. The source line SL1 may return from the third voltage V3 to the ground voltage Vss after the fourth time T4.

When the source line SL1 drops from the ground voltage Vss to the third voltage V3 at the second time T2, a current flows to the source line SL1 from the bit lines BL0 to BL2. As a result, in a portion of the channel region 7, which is a P layer, adjacent to the second impurity layer 3b, which is an $N^+$ layer, an impact ionization phenomenon occurs and electron-positive hole pairs are generated. At this time, the group of positive holes 9 that are generated in the channel region 7 and the group of positive holes 9 that are discharged to the first impurity layer 3a are in balance, which is a saturation state, and the page erase operation ends.

Figure 4C:
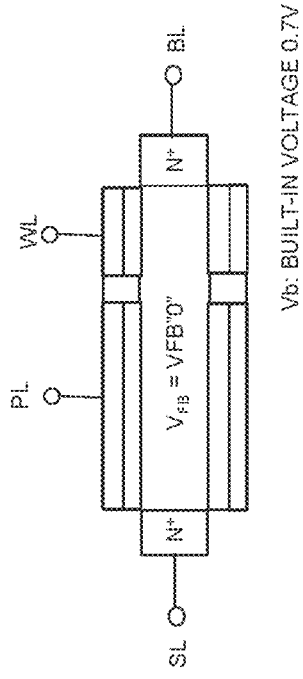
FIGS. 4CA, 4CB and 4CC are diagrams for explaining the mechanism of the page erase operation of the memory device according to the first embodiment.
Figure 4C:
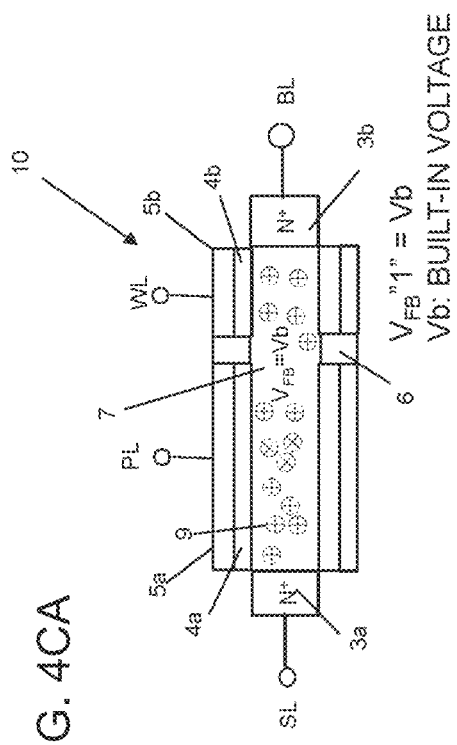
Figure 4C:
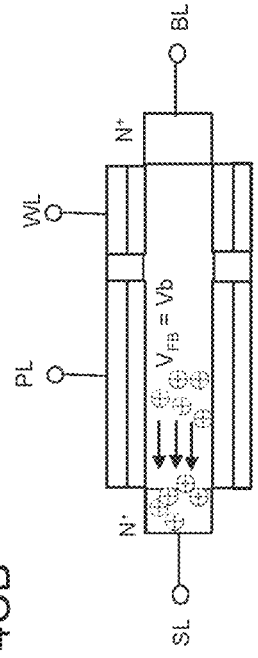

The state of the semiconductor body during the erase operation will be described with reference to FIGS. 4CA to 4CC. FIG. 4CA illustrates a state before the erase operation, in which the group of positive holes 9 generated by impact ionization are accumulated in the channel region 7. When the page erase operation starts, the PN junction between the source $N^+$ layer 3a and the channel region 7 is in a forward bias state as illustrated in FIG. 4CB, and the group of positive holes 9 in the channel region 7 are discharged to the source $N^+$ layer 3a. As a result, the voltage $V_{FB}$ of the channel region 7 becomes equal to the built-in voltage Vb of the PN junction formed by the source $N^+$ layer 3a and the P-layer channel region 7.

Subsequently, when the word line WL and the plate line PL for selective erasing returns from the first voltage V1 and the second voltage V2 to the ground voltage Vss, the voltage $V_{FB}$ of the channel region 7 changes from Vb to $V_{FB}$ "0" due to capacitive coupling between the word line WL and the channel region 7 and between the plate line PL and the channel region 7. This state is illustrated in FIG. 4CC.

Note that the conditions of voltages applied to the bit line BL, the source line SL, the word line WL, and the plate line PL and the potential of the floating body described above are examples for performing the page erase operation, and other operation conditions based on which the page erase operation can be performed may be employed.

FIG. 4D is an operation waveform diagram in a case where the voltage of the source line SL is set to a positive voltage ("which is an example of "positive voltage" in the claims) in the page erase operation. A case where the page erase operation starts and, for example, selective erasing for the page P1 is performed will be described. At the first time T1, the word line WL1 and the plate line PL1 rise from the ground voltage Vss to a fourth voltage V4 and a fifth voltage V5 respectively. Here, the ground voltage Vss is equal to, for example, 0 V. The fourth voltage V4 and the fifth voltage V5 are equal to, for example, 1 V. Next, at the second time T2, the source line SL1 rises from the ground voltage Vss to a sixth voltage V6. Here, the sixth voltage V6 is equal to, for example, 0.5 V. As a result, a current flows from the source line SL1 to the bit lines BL0 to BL2, and a group of electrons are poured into the channel region 7, which is a Player, from the second impurity layer 3b, which is an $N^+$ layer. The group of electrons are recombined with the group of positive holes 9 accumulated in the channel region 7, and the group of positive holes 9 in the channel region 7 become extinct. When the extinction of the group of positive holes 9 accumulated in the channel region 7 approaches saturation, at the third time T3, the source line SL1 returns from the sixth voltage V6 to the ground voltage Vss, and at the fourth time T4, the word line WL1 and the plate line PL1 respectively return from the fourth voltage V4 and the fifth voltage V5 to the ground voltage Vss, and the page erase operation ends. The page erase operation in which the voltage $V_{FB}$ "0" in the "0" erase state of the channel region 7 is assumed to be the second data retention voltage is performed to assign logical storage data "0".

Note that one of the word line WL1 or the plate line PL1 may rise from the ground voltage Vss to the fourth voltage V4 or the fifth voltage V5 before or after the first time T1. The source line SL1 may rise from the ground voltage Vss to the sixth voltage V6 before the first time T1. One of the word line WL1 or the plate line PL1 may return from the fourth voltage V4 or the fifth voltage V5 to the ground voltage Vss before or after the fourth time T4. The source line SL1 may return from the sixth voltage V6 to the ground voltage Vss after the fourth time T4.

When the source line SL1 rises from the ground voltage Vss to the sixth voltage V6 at the second time T2, a current flows from the source line SL1 to the bit lines BL0 to BL2. As a result, in a portion of the channel region 7, which is a P layer, adjacent to the first impurity layer 3a, which is an $N^+$ layer, an impact ionization phenomenon occurs and electron-positive hole pairs are generated. At this time, the group of positive holes 9 that are generated in the channel region 7 and the group of positive holes 9 that are extinct in the channel region 7 are in balance, which is a saturation state, and the page erase operation ends.

Figure 4E:
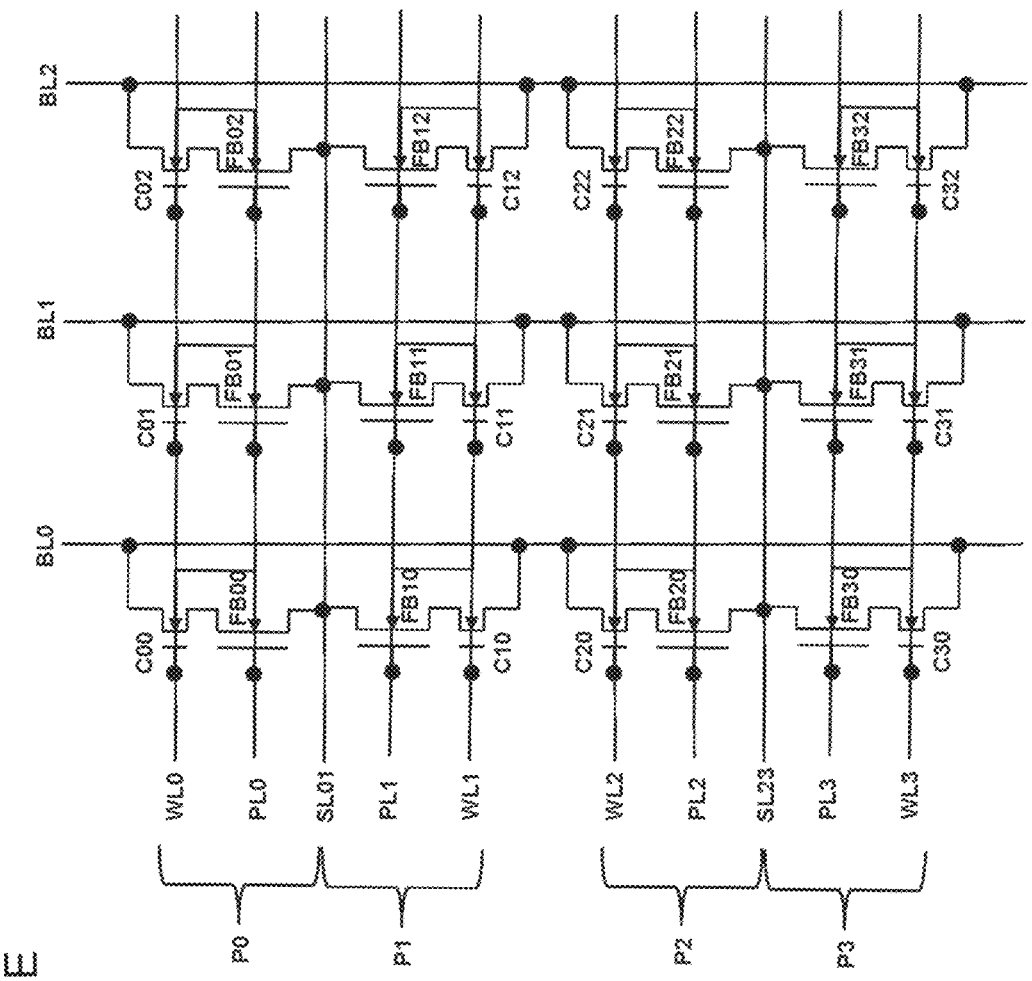
FIG. 4E is a diagram for explaining the mechanism of the page erase operation of the memory device according to the first embodiment.

FIG. 4E is a circuit diagram of a memory block in a case where the source line SL is disposed so as to be shared between pages adjacent to each other. A source line SL01 of two pages P0 and P1 is shared, and a source line SL23 of two pages P2 and P3 is shared.

Figure 4F:
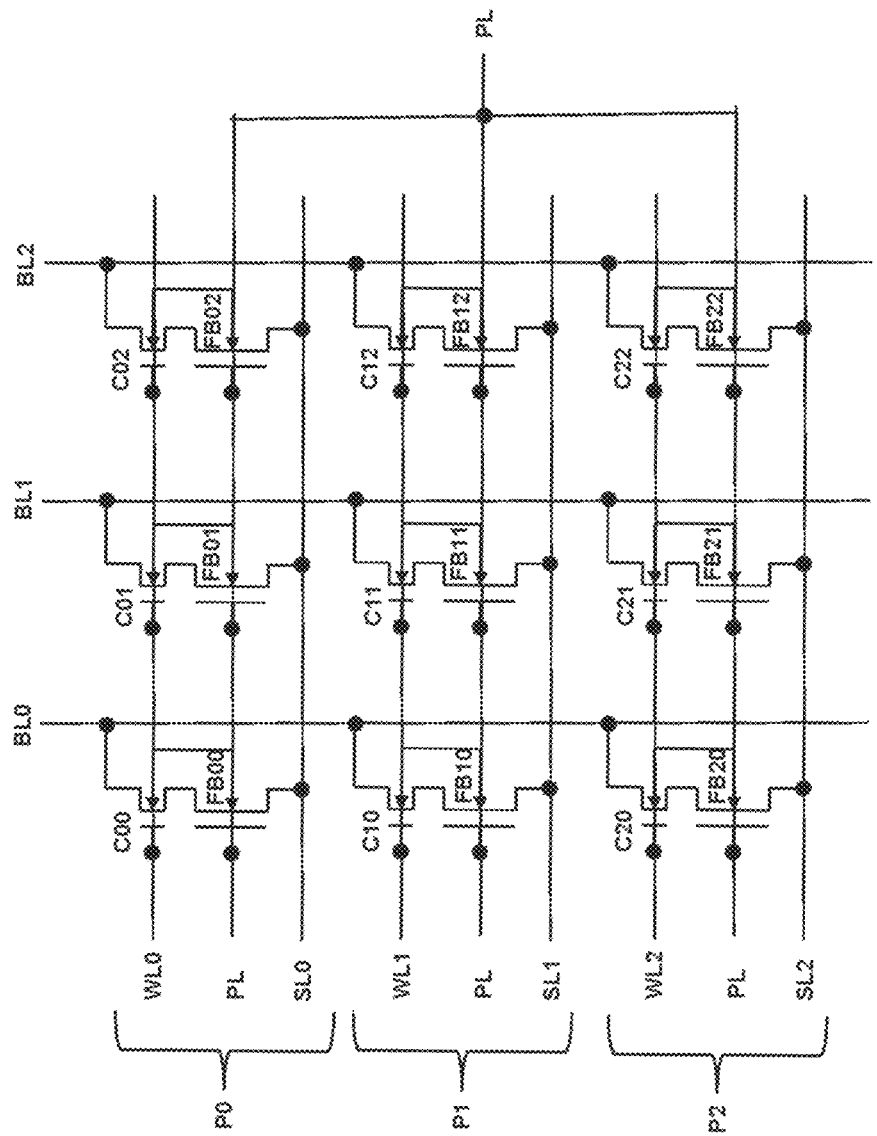
FIG. 4F is a diagram for explaining the mechanism of the page erase operation of the memory device according to the first embodiment.

FIG. 4F is a circuit diagram of a memory block in a case where the plate line PL is disposed so as to be shared between at least two or more pages adjacent to each other. The plate line PL of three pages P0 to P2 is shared.

Figure 4G:
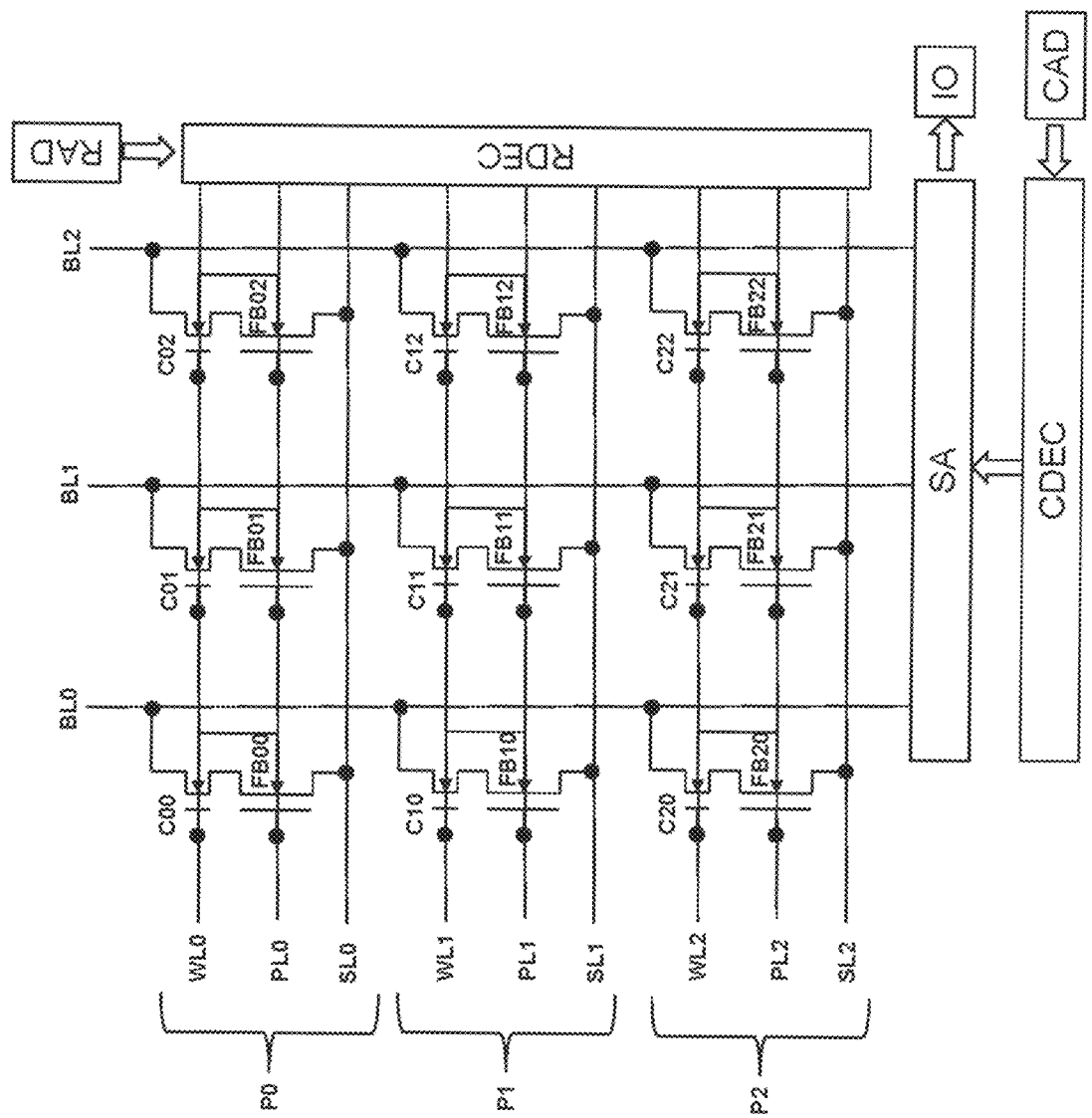
FIG. 4G is a diagram for explaining the mechanism of the page erase operation of the memory device according to the first embodiment.

FIG. 4G is a diagram of a memory block including main circuits. The word lines WL0 to WL2, the plate lines PL0 to PL2, and the source lines SL0 to SL2 are connected to a row decoder circuit RDEC (which is an example of "row decoder circuit" in the claims), the row decoder circuit receives a row address RAD (which is an example of "row address" in the claims), and selection from the pages P0 to P2 is made in accordance with the row address RAD. The bit lines BL0 to BL2 are connected to a sense amplifier circuit SA (which is an example of "sense amplifier circuit" in the claims), the sense amplifier circuit SA is connected to a column decoder circuit CDEC (which is an example of "column decoder circuit" in the claims), the column decoder circuit CDEC receives a column address CAD (which is an example of "column address" in the claims), and the sense amplifier circuit SA is selectively connected to an input/output circuit IO (which is an example of "input/output circuit" in the claims) in accordance with the column address CAD.

Figure 5B:
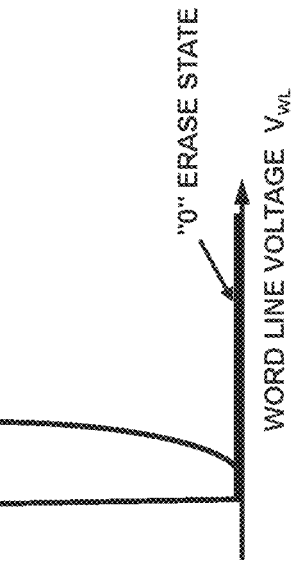
FIGS. 5BA, 5BB and 5BC are diagrams for explaining the mechanism of the read operation of the memory device according to the first embodiment.
Figure 5B:
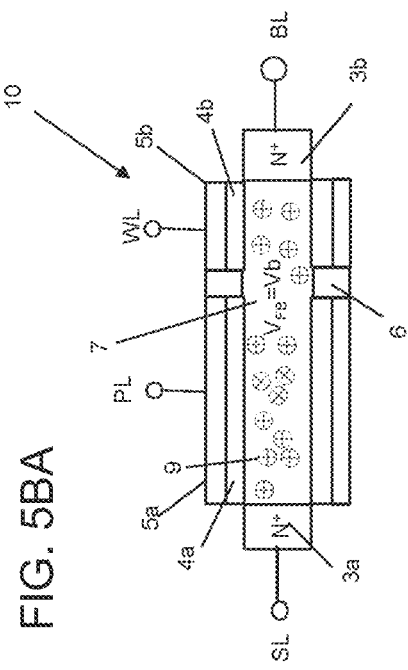
Figure 5B:
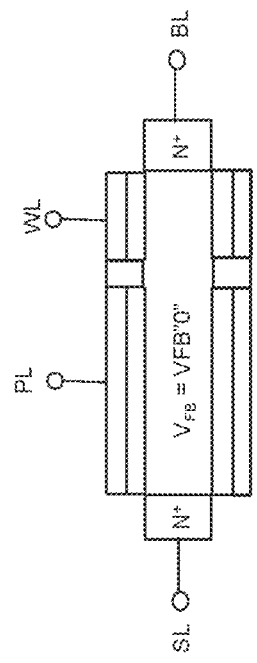
Figure 7A:
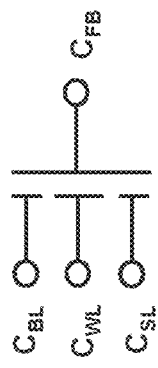
FIGS. 7A and 7B are diagrams for explaining a problem in the operation of the DRAM memory cell including no capacitor in the related art.
Figure 7B:
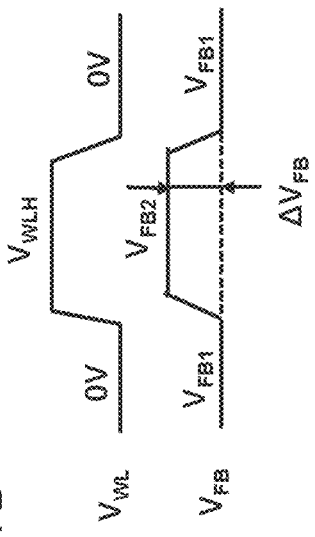

FIGS. 5AA to 5AC and FIGS. 5BA to 5BC are diagrams for explaining a read operation of the dynamic flash memory cell according to the first embodiment of the present invention. With reference to FIGS. 5AA to 5AC, determination as to whether or not a memory cell current flows, that is, determination of logical "1" or logical "0", based on the AND logic regarding the word line WL and the plate line PL will be described. As illustrated in FIG. 5AA, the levels of the threshold voltages of the word line WL and the plate line PL are determined on the basis of the voltage of the floating body FB. The presence or absence of a memory cell current is determined on the basis of whether the voltages of the word line WL and the plate line PL become equal to their respective threshold voltages or above and whether the word line WL and the plate line PL are conducting or non-conducting. That is, as illustrated in FIG. 5AB, the memory cell current Icell is expressed by expression (8) based on the AND logic regarding whether the word line WL is conducting "1" or non-conducting "0" and whether the plate line PL is conducting "1" or non-conducting "0".

$$\text{Icell} = WL \cdot PL \tag{8}$$

As illustrated in FIG. 5BA, when the channel region 7 is charged up to the built-in voltage Vb (about 0.7 V), the threshold voltage of the second N-channel MOS transistor region including the second gate conductor layer 5b to which the word line WL is connected decreases due to a substrate bias effect. This state is assigned to logical storage data "1". As illustrated in FIG. 5BB, a memory block selected before writing is in an erase state "0" in advance, and the voltage $V_{FB}$ of the channel region 7 is equal to $V_{FB}"0"$. With a write operation, a write state "1" is stored at random. As a result, logical storage data of logical "0" and that of logical "1" are created for the word line WL. As illustrated in FIG. 5BC, the level difference between the two threshold voltages of the word line WL is used to perform reading by a sense amplifier.

Note that the conditions of voltages applied to the bit line BL, the source line SL, the word line WL, and the plate line PL and the potential of the floating body described above are examples for performing the read operation, and other operation conditions based on which the read operation can be performed may be employed.

Regardless of whether the horizontal cross-sectional shape of the Si column 2 illustrated in FIG. 1 is a round shape, an elliptic shape, or a rectangular shape, the operations of the dynamic flash memory described in the embodiment can be performed. Further, a dynamic flash memory cell having a round shape, a dynamic flash memory cell having an elliptic shape, and a dynamic flash memory cell having a rectangular shape may coexist on the same chip.

With reference to FIG. 1, the dynamic flash memory element including, for example, an SGT in which the first gate insulator layer 4a and the second gate insulator layer 4b that surround the entire side surface of the Si column 2 standing on the substrate in the vertical direction are provided and which includes the first gate conductor layer 5a and the second gate conductor layer 5b that entirely surround the first gate insulator layer 4a and the second gate insulator layer 4b has been described. As indicated in the description of the embodiment, the dynamic flash memory element needs to have a structure that satisfies the condition that the group of positive holes 9 generated by an impact ionization phenomenon are retained in the channel region 7. For this, the channel region 7 needs to have a floating body structure isolated from the substrate. Accordingly, even when the semiconductor body of the channel region is formed horizontally along the substrate (such that the central-axis direction of the semiconductor body is parallel to the substrate) by using, for example, GAA (Gate All Around, see, for example, J. Y. Song, W. Y. Choi, J. H. Park, J. D. Lee, and B-G. Park: "Design Optimization of Gate-All-Around (GAA) MOSFETs", IEEE Trans. Electron Devices, vol. 5, no. 3, pp. 186-191, May 2006) technology, which is one type of SGT, or nanosheet technology (see, for example, N. Loubet, et al.: "Stacked Nanosheet Gate-All-Around Transistor to Enable Scaling Beyond FinFET", 2017 IEEE Symposium on VLSI Technology Digest of Technical Papers, T17-5, T230-T231, June 2017), the above-described operations of the dynamic flash memory can be performed. The dynamic flash memory element may have a structure in which a plurality of GAA transistors or nanosheets formed in the horizontal direction are stacked. Alternatively, the dynamic flash memory element may have a device structure using SOI (Silicon On Insulator) (see, for example, J. Wan, L. Rojer, A. Zaslavsky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida and T. Tanaka: "A Design of Capacitorless 1T-DRAM Cell Using Gate-Induced Drain Leakage (GIDL) Current for Low-Power and High-Speed Embedded Memory", IEEE IEDM (2003)). In this device structure, the bottom portion of the channel region is in contact with an insulating layer of the SOI substrate, and the other portion of the channel region is surrounded by a gate insulator layer and an element isolation insulating layer. With such a structure, the channel region also has a floating body structure. Accordingly, the dynamic flash memory element provided in the embodiment needs to satisfy the condition that the channel region has a floating body structure. Even with a structure in which a Fin transistor (see, for example, H. Jiang, N. Xu, B. Chen, L. Zeng1, Y. He, G. Du, X. Liu and X. Zhang: "Experimental investigation of self-heating effect (SHE) in multiple-fin SOI FinFETs", Semicond. Sci. Technol. 29 (2014) 115021 (7pp)) is formed on an SOI substrate, as long as the channel region has a floating body structure, the dynamic flash operations can be performed.

Expressions (1) to (11) provided in the specification and in the drawings are expressions used to qualitatively explain the phenomena, and are not intended to limit the phenomena.

Although the reset voltages of the word line WL, the bit line BL, and the source line SL are specified as Vss in the descriptions of FIGS. 3AA to 3AC and FIG. 3B, the reset voltages of the respective lines may be set to different voltages.

Although FIG. 4A to FIG. 4G and the descriptions thereof illustrate example conditions of the page erase operation, the voltages applied to the source line SL, the plate line PL, the bit line BL, and the word line WL may be changed as long as a state in which the group of positive holes 9 in the channel region 7 are discharged through either the N+ layer 3a or the N+ layer 3b or both the N+ layer 3a and the N+ layer 3b can be attained. Further, in the page erase operation, a voltage may be applied to the source line SL of a selected page, and the bit line BL may be put in a floating state. In the page erase operation, a voltage may be applied to the bit line BL of a selected page, and the source line SL may be put in a floating state.

In FIG. 1, in a direction perpendicular to the substrate, in a portion of the channel region 7 surrounded by the insulating layer 6 that is the first insulating layer, the potential distribution of the first channel region 7a and that of the second channel region 7b are connected and formed. Accordingly, the first channel region 7a and the second channel region 7b that constitute the channel region 7 are connected in the vertical direction in the region surrounded by the insulating layer 6 that is the first insulating layer.

Note that in FIG. 1, it is desirable to make the length of the first gate conductor layer 5a, in the vertical direction, to which the plate line PL is connected further longer than the length of the second gate conductor layer 5b, in the vertical direction, to which the word line WL is connected to attain $C_{PL} > C_{WL}$. However, when only the plate line PL is added, the coupling ratio ($C_{WL}/(C_{PL}+C_{WL}+C_{BL}+C_{SL})$), of capacitive coupling, of the word line WL to the channel region 7 decreases. As a result, the potential change $\Delta V_{FB}$ of the channel region 7 that is a floating body decreases.

Note that in the specification and the claims, the meaning of "cover" in a case of "for example, a gate insulator layer or a gate conductor layer covers, for example, a channel" also includes a case of surrounding entirely as in an SGT or GAA, a case of surrounding except a portion as in a Fin transistor, and a case of overlapping a flat object as in a planar transistor.

Although the first gate conductor layer 5a entirely surrounds the first gate insulator layer 4a in FIG. 1, a structure may be employed in which the first gate conductor layer 5a partially surrounds the first gate insulator layer 4a in plan view. The first gate conductor layer 5a may be divided into at least two gate conductor layers, and the gate conductor layers may each be operated as a plate line PL electrode. Similarly, the second gate conductor layer 5b may be divided into two or more gate conductor layers, and the gate conductor layers may each function as a conductive electrode of the word line and may be operated synchronously or asynchronously. Accordingly, the operations of the dynamic flash memory can be performed.

In FIG. 1, the first gate conductor layer 5a may be connected to the word line WL and the second gate conductor layer 5b may be connected to the plate line PL. In this case, the above-described operations of the dynamic flash memory can also be performed.

The embodiment has the following features.

Feature 1

The dynamic flash memory cell of the embodiment is constituted by the N+ layers 3a and 3b that function as the source and the drain, the channel region 7, the first gate insulator layer 4a, the second gate insulator layer 4b, the first gate conductor layer 5a, and the second gate conductor layer 5b, which are formed in a columnar form as a whole. The N+ layer 3a that functions as the source is connected to the source line SL, the N+ layer 3b that functions as the drain is connected to the bit line BL, the first gate conductor layer 5a is connected to the plate line PL, and the second gate conductor layer 5b is connected to the word line WL. A structure is employed in which the gate capacitance of the first gate conductor layer 5a to which the plate line PL is connected is larger than the gate capacitance of the second gate conductor layer 5b to which the word line WL is connected, which is a feature. In the dynamic flash memory cell, the first gate conductor layer and the second gate conductor layer are stacked in the vertical direction. Accordingly, even when the structure is employed in which the gate capacitance of the first gate conductor layer 5a to which the plate line PL is connected is larger than the gate capacitance of the second gate conductor layer 5b to which the word line WL is connected, the memory cell area does not increase in plan view. Accordingly, a high-performance and highly integrated dynamic flash memory cell can be implemented.

Feature 2

In the dynamic flash memory cell according to the first embodiment of the present invention, the source line SL, the word line WL, and the plate line PL are disposed parallel to each page P. The bit line BL is disposed in a direction perpendicular to the pages P. As a result, the word line WL, the plate line PL, and the source line SL for controlling each page P can be controlled independently on a page-by-page basis. At the time of the page erase operation, an erase voltage is applied to only the source line SL of a page P for which selective erasing is performed, and the ground voltage Vss can be applied to the source line SL of a non-selected page. Accordingly, a disturbance to the non-selected page P created by the selected page P in the page erase operation can be satisfactorily prevented. Therefore, even when a specific page P is selected a plurality of times and the stored data in the memory cells of the page P is repeatedly rewritten, the memory cells of the other pages P are not affected by a disturbance, and a highly reliable memory device having significantly strong resilience to a disturbance cycle can be provided.

Feature 3

In terms of the roles of the first gate conductor layer 5a to which the plate line PL is connected in the dynamic flash memory cell according to the first embodiment of the present invention, in the write operation and in the read operation performed by the dynamic flash memory cell, the voltage of the word line WL changes. At this time, the plate line PL assumes the role of decreasing the capacitive coupling ratio between the word line WL and the channel region 7. As a result, an effect on changes in the voltage of the channel region 7 when the voltage of the word line WL changes can be substantially suppressed. Accordingly, the difference between the threshold voltages of the SGT transistor of the word line WL indicating logical "0" and logical "1" can be increased. This leads to an increased operation margin of the dynamic flash memory cell.

OTHER EMBODIMENTS

Although the Si column is formed in the present invention, a semiconductor column made of a semiconductor material other than Si may be formed. The same applies to other embodiments according to the present invention.

To write "1", electron-positive hole pairs may be generated by an impact ionization phenomenon using a gate-induced drain leakage (GIDL) current described in E. Yoshida and T. Tanaka: "A Design of Capacitorless 1T-DRAM Cell Using Gate-Induced Drain Leakage (GIDL) Current for Low-Power and High-Speed Embedded Memory", IEEE IEDM (2003) and E. Yoshida, and T. Tanaka: "A Capacitorless 1T-DRAM Technology Using Gate-Induced Drain-Leakage (GIDL) Current for Low-Power and High-Speed Embedded Memory", IEEE Transactions on Electron Devices, Vol. 53, No. 4, pp. 692-69, April 2006, and the floating body FB may be filled with the generated group of positive holes. The same applies to other embodiments according to the present invention.

Even with a structure in which the polarity of the conductivity type of each of the N+ layers 3a and 3b and the P-layer Si column 2 in FIG. 1 is reversed, the operations of the dynamic flash memory can be performed. In this case, in the Si column 2 that is of N-type, the majority carriers are electrons. Therefore, a group of electrons generated by impact ionization are accumulated in the channel region 7, and a "1" state is set.

The Si columns of the memory cells may be arranged in two dimensions in a square lattice or in a diagonal lattice to form a memory block. When the Si columns are disposed in a diagonal lattice, the Si columns connected to one word line may be disposed in a zigzag pattern or a serrated pattern in which each segment is constituted by a plurality of Si columns. The same applies to other embodiments.

Various embodiments and modifications can be made to the present invention without departing from the spirit and scope of the present invention in a broad sense. The above-described embodiments are intended to explain examples of the present invention and are not intended to limit the scope of the present invention. Any of the above-described embodiments and modifications can be combined. Further, the above-described embodiments from which some of the configuration requirements are removed as needed are also within the scope of the technical spirit of the present invention.

With the semiconductor-element-including memory device according to the present invention, a high-density and high-performance dynamic flash memory that is an SGT-including memory device can be obtained.

What is claimed is:

1. A semiconductor-element-including memory device that is a memory device in which in plan view on a substrate, a plurality of pages are arranged in a column direction, each of the pages being constituted by a plurality of memory cells arranged in a row direction, each memory cell included in each page comprising:
a semiconductor body that stands on the substrate in a vertical direction relative to the substrate or that extends along the substrate in a horizontal direction relative to the substrate;
a first impurity layer and a second impurity layer that are disposed at respective ends of the semiconductor body;
a first gate insulator layer that partially or entirely surrounds a side surface of the semiconductor body between the first impurity layer and the second impurity layer and that is in contact with or in close vicinity to the first impurity layer;
a second gate insulator layer that surrounds the side surface of the semiconductor body, that is connected to the first gate insulator layer, and that is in contact with or in close vicinity to the second impurity layer;
a first gate conductor layer that partially or entirely covers the first gate insulator layer;
a second gate conductor layer that covers the second gate insulator layer; and
a channel semiconductor layer that is the semiconductor body and that is covered by the first gate insulator layer and the second gate insulator layer, wherein voltages applied to the first gate conductor layer, the second gate conductor layer, the first impurity layer, and the second impurity layer are controlled to retain a group of positive holes, generated by an impact ionization phenomenon, inside the channel semiconductor layer, in a page write operation, a voltage of the channel semiconductor layer is made equal to a first data retention voltage that is higher than the voltage of either the first impurity layer or the second impurity layer or that is higher than the voltages of both the first impurity layer and the second impurity layer, in a page erase operation, the group of positive holes are discharged through either the first impurity layer or the second impurity layer or both the first impurity layer and the second impurity layer by controlling the voltages applied to the first impurity layer, the second impurity layer, the first gate conductor layer, and the second gate conductor layer, and the voltage of the channel semiconductor layer is made equal to a second data retention voltage that is lower than the first data retention voltage, the first impurity layer of each memory cell is connected to a corresponding one of source lines, the second impurity layer thereof is connected to a corresponding one of bit lines, one of the first gate conductor layer or the second gate conductor layer thereof is connected to a corresponding one of word lines, and the other of the first gate conductor layer or the second gate conductor layer thereof is connected to a corresponding one of plate lines, the source lines, the word lines, and the plate lines are disposed parallel to the pages in plan view, the bit lines are disposed in a direction perpendicular to the pages, and in the page erase operation, an erase voltage is applied to a page, among the pages, for which selective erasing is performed, and a ground voltage is applied to a non-selected page among the pages.

2. The semiconductor-element-including memory device according to claim 1, wherein
a first gate capacitance between the first gate conductor layer and the channel semiconductor layer is larger than a second gate capacitance between the second gate conductor layer and the channel semiconductor layer.

3. The semiconductor-element-including memory device according to claim 1, wherein
the ground voltage is zero volts.

4. The semiconductor-element-including memory device according to claim 1, wherein
the erase voltage is a negative voltage lower than or equal to the ground voltage, and in the page erase operation, the erase voltage is applied to a source line, among the source lines, of the page for which selective erasing is performed, a PN junction between the channel semiconductor layer and the first impurity layer of each memory cell in the page is forward biased, and the group of positive holes inside the channel semiconductor layer are discharged to the first impurity layer.

5. The semiconductor-element-including memory device according to claim 1, wherein
the erase voltage is a positive voltage higher than or equal to the ground voltage, and in the page erase operation, the erase voltage is applied to a source line, among the source lines, of the page for which selective erasing is performed, a group of electrons are poured into the channel semiconductor layer from the second impurity layer of each memory cell in the page, the group of positive holes inside the channel semiconductor layer are made to be recombined with the group of electrons, and the group of positive holes are made to become extinct.

6. The semiconductor-element-including memory device according to claim 1, wherein
in plan view, the source lines are isolated source lines disposed for respective groups of memory cells arranged in the column direction, and are disposed parallel to the word lines and the plate lines.

7. The semiconductor-element-including memory device according to claim 1, wherein
in plan view, the source lines include a source line that is disposed so as to be shared between pages adjacent to each other.

8. The semiconductor-element-including memory device according to claim 1, wherein
in plan view, the plate lines include a plate line that is disposed so as to be shared between at least two or more pages adjacent to each other.

9. The semiconductor-element-including memory device according to claim 1, wherein
the channel semiconductor layer is P-type silicon, and the first impurity layer and the second impurity layer are N-type silicon.

10. The semiconductor-element-including memory device according to claim 1, wherein
the word lines, the plate lines, and the source lines are connected to a row decoder circuit, the row decoder circuit receives a row address, and the page is selected in accordance with the row address.

11. The semiconductor-element-including memory device according to claim 1, wherein
the bit lines are connected to a sense amplifier circuit, the sense amplifier circuit is connected to a column decoder circuit, the column decoder circuit receives a column address, and the sense amplifier circuit is selectively connected to an input/output circuit in accordance with the column address.

\* \* \* \* \*